United States Patent
Nequist

(10) Patent No.: US 7,461,359 B1
(45) Date of Patent: Dec. 2, 2008

(54) METHOD AND MECHANISM FOR DETERMINING SHAPE CONNECTIVITY

(75) Inventor: Eric Nequist, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 367 days.

(21) Appl. No.: 11/229,344

(22) Filed: Sep. 15, 2005

Related U.S. Application Data

(60) Provisional application No. 60/611,071, filed on Sep. 16, 2004.

(51) Int. Cl.
*G06F 17/50* (2006.01)

(52) U.S. Cl. .................. 716/1; 716/3; 716/4; 716/5; 716/12; 716/18

(58) Field of Classification Search ............... 716/1–5, 716/16–18, 12
See application file for complete search history.

(56) References Cited

U.S. PATENT DOCUMENTS

| 6,066,180 | A | 5/2000 | Kim et al. |
| 2005/0132320 | A1 | 6/2005 | Alien et al. |
| 2005/0204315 | A1 | 9/2005 | Knol et al. |
| 2006/0112356 | A1* | 5/2006 | McGaughy et al. ............ 716/3 |

* cited by examiner

*Primary Examiner*—Paul Dinh
(74) *Attorney, Agent, or Firm*—Vista IP Law Group LLP

(57) ABSTRACT

A method and mechanism is disclosed for identifying connected shapes and objects in an electrical design. The entire hierarchical design does not have to be flattened to perform the operation of identifying connected objects for a specific object. Instead of unfolding the entire design hierarchy, only the specific instances of shapes falling within the geometric bounds of shapes need to be unfolded to perform the search.

15 Claims, 33 Drawing Sheets

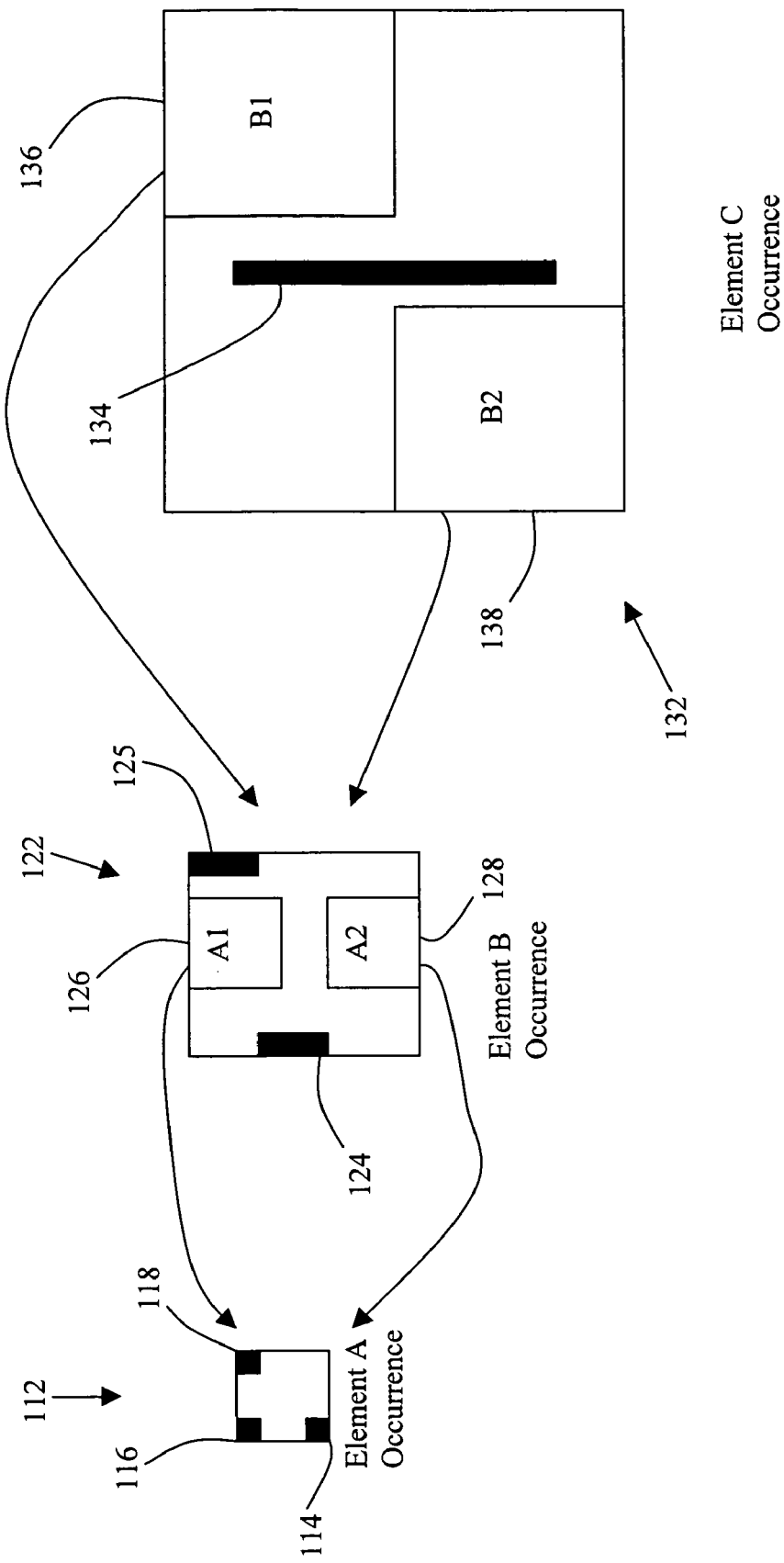

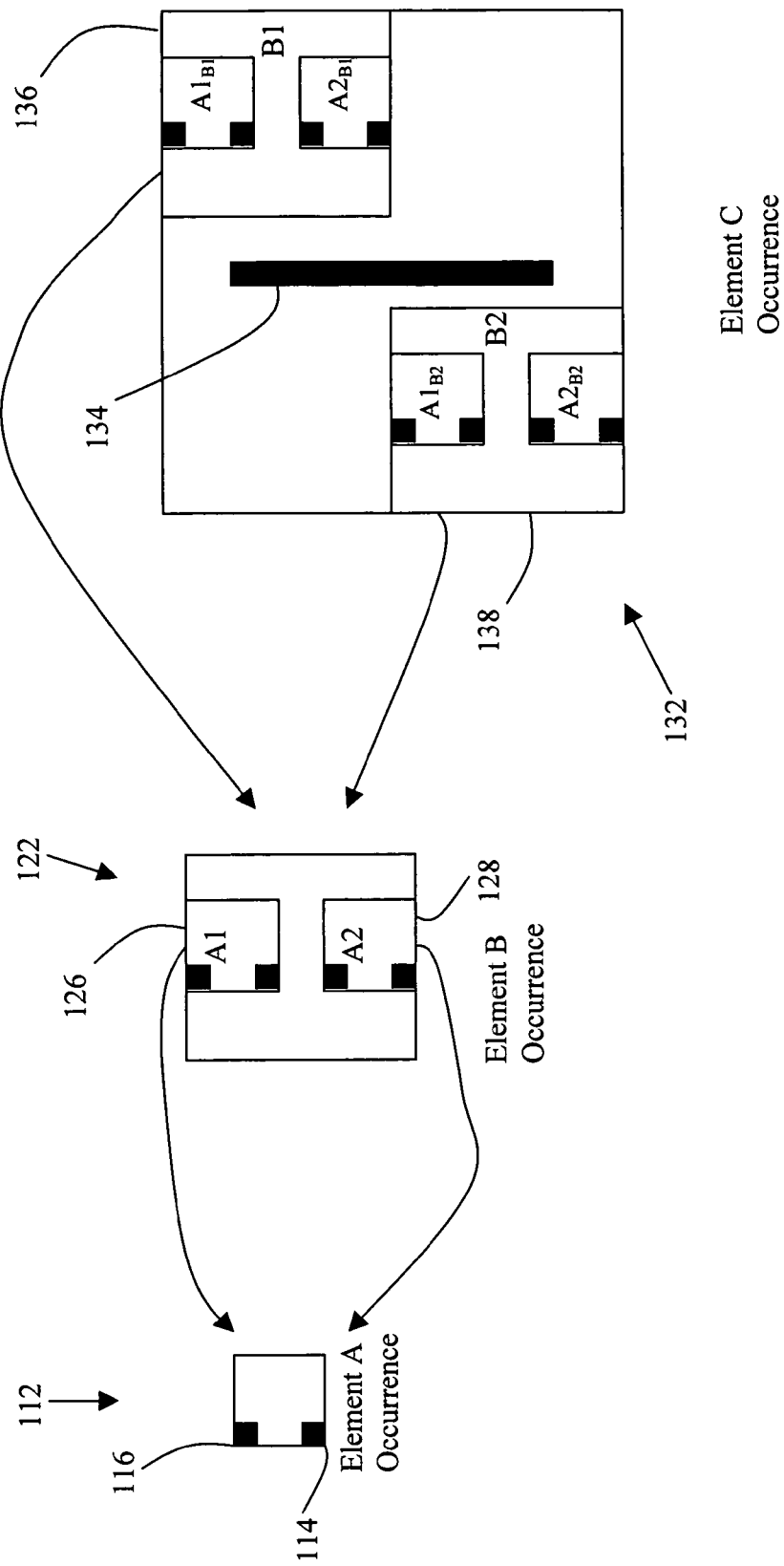
Fig. 1B Layer 1 Shapes

Layer 2 Shapes

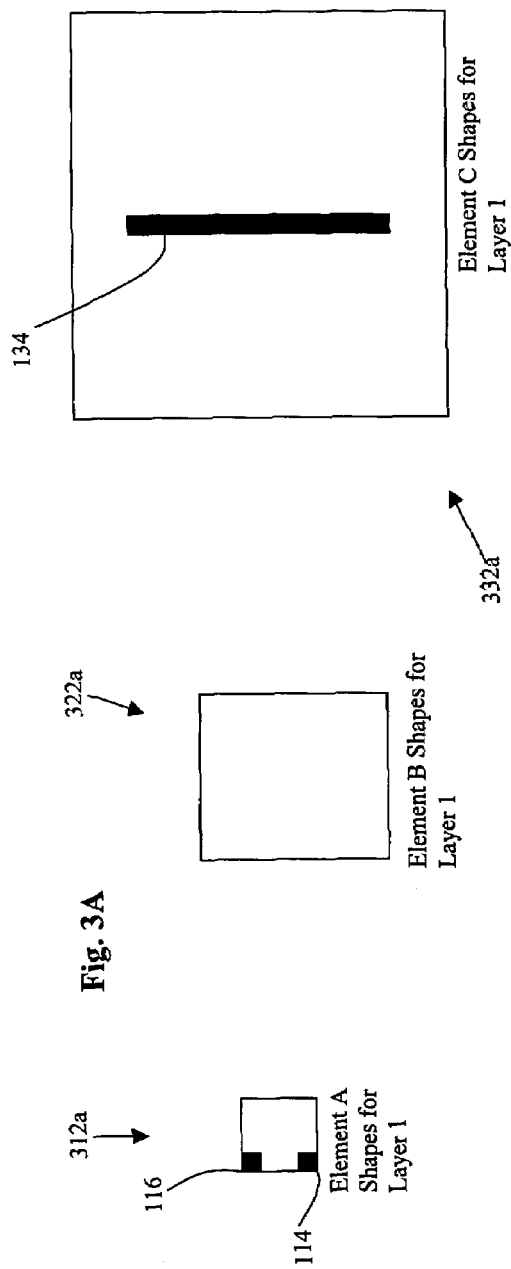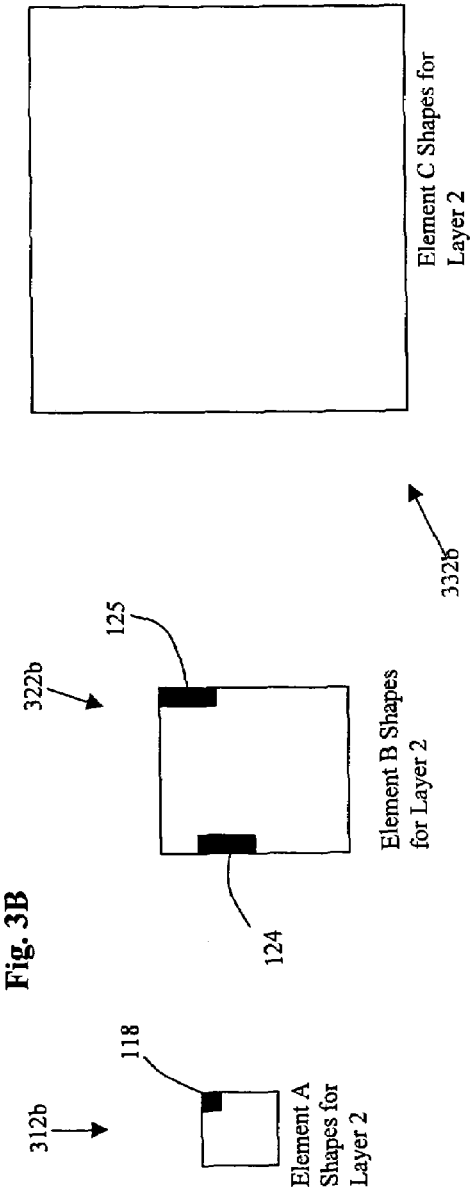
Fig. 3A
Fig. 3B

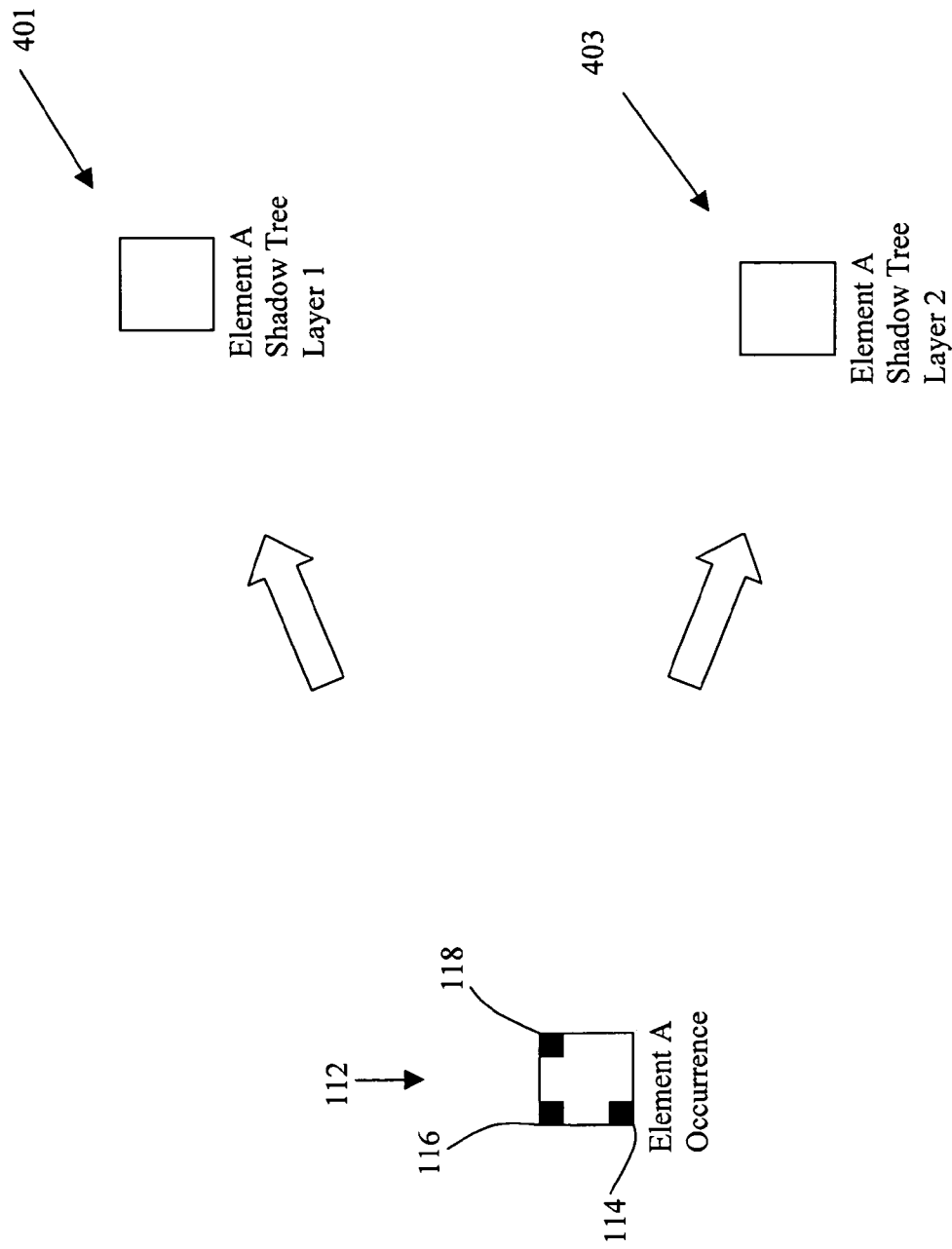

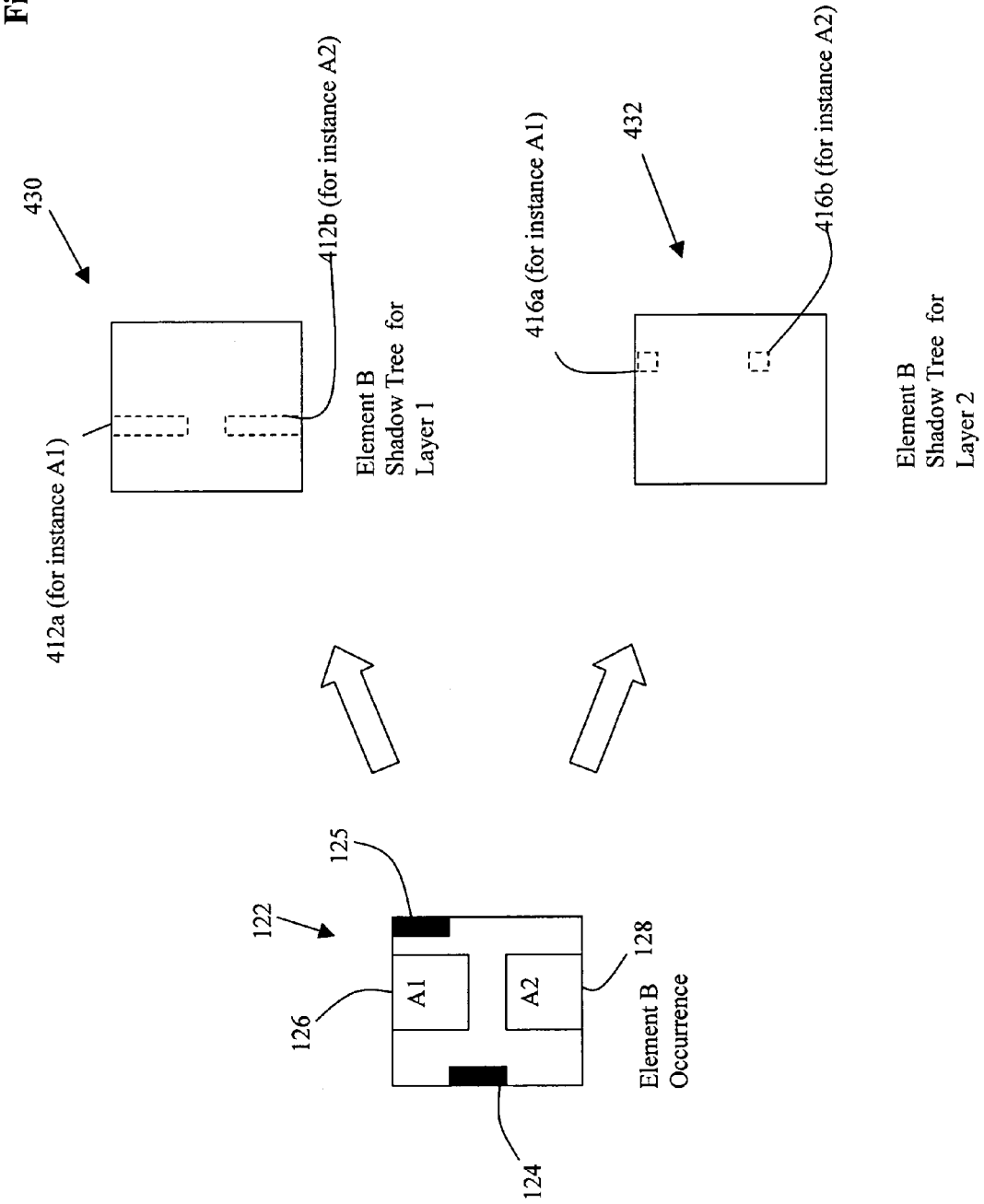

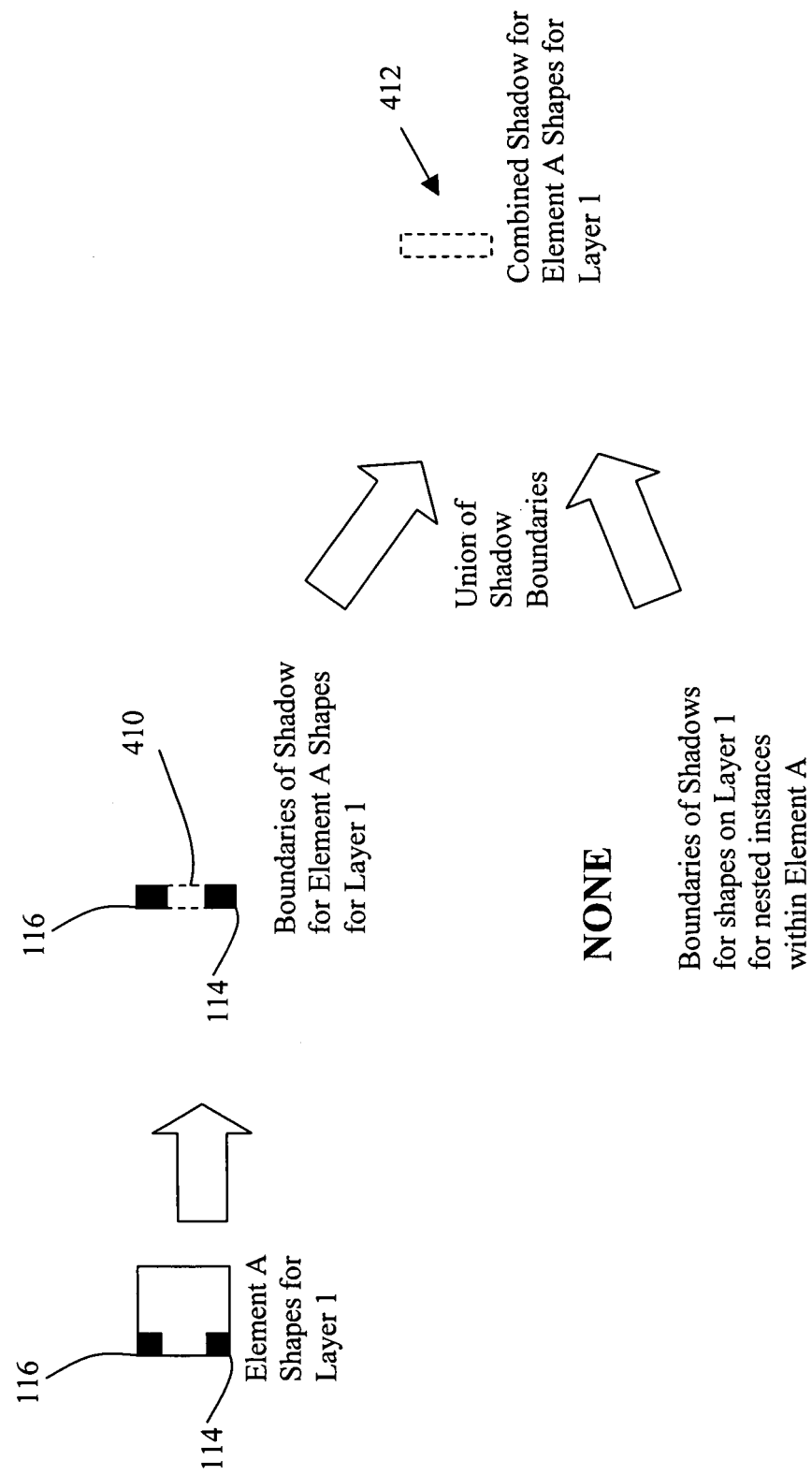

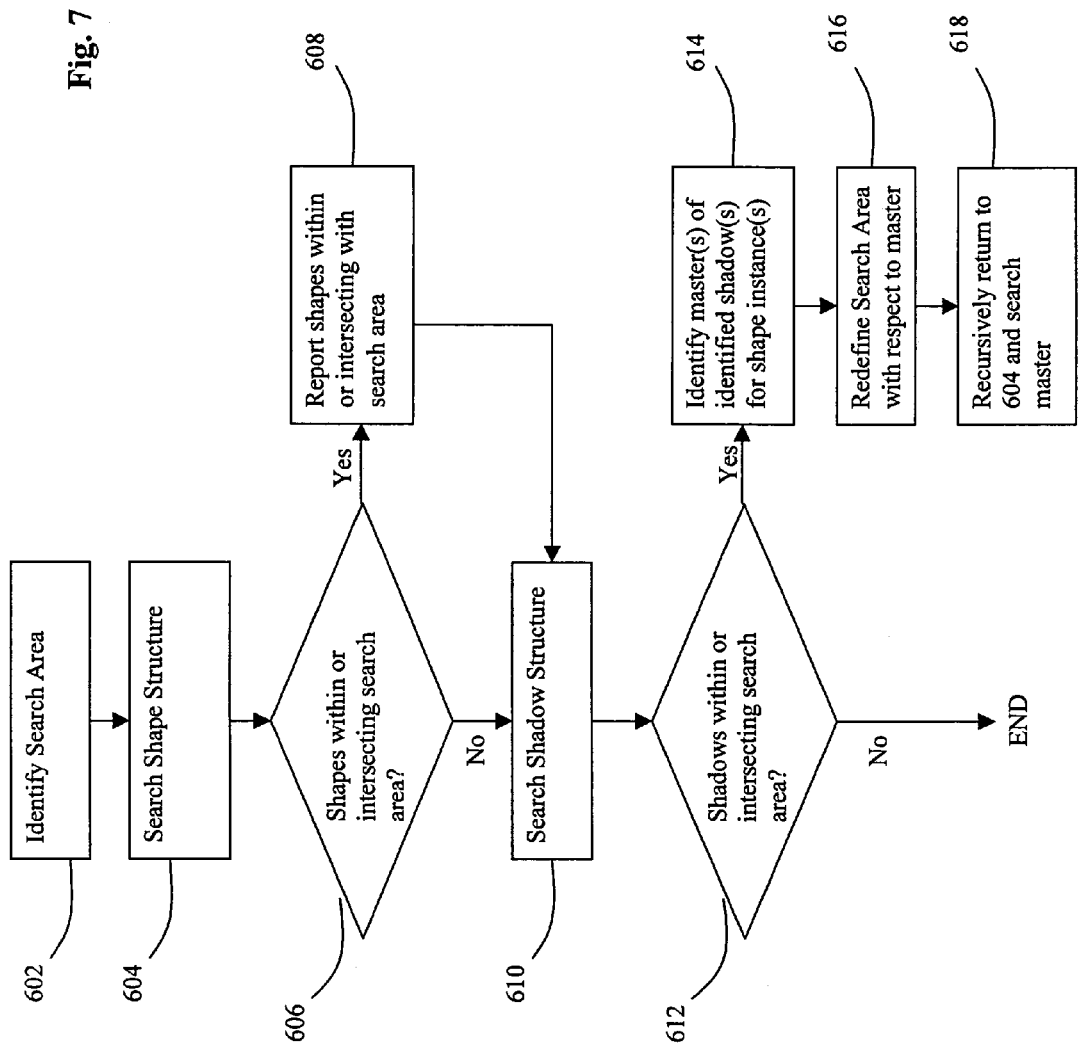

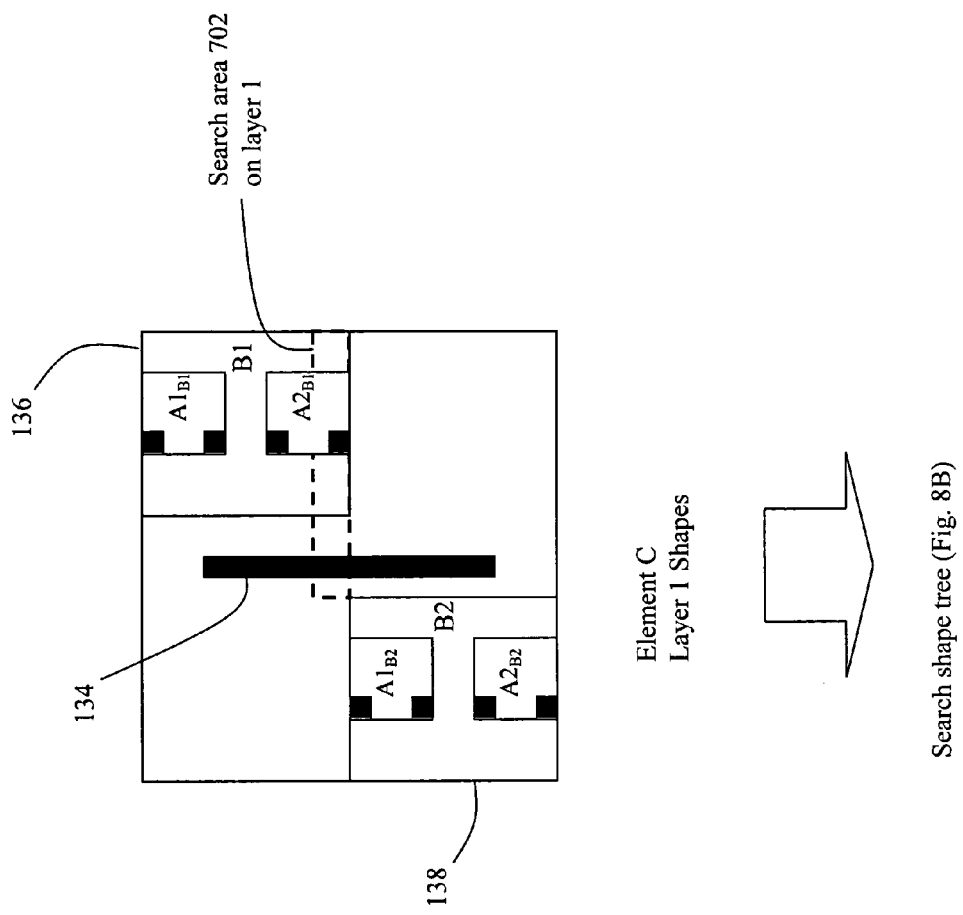

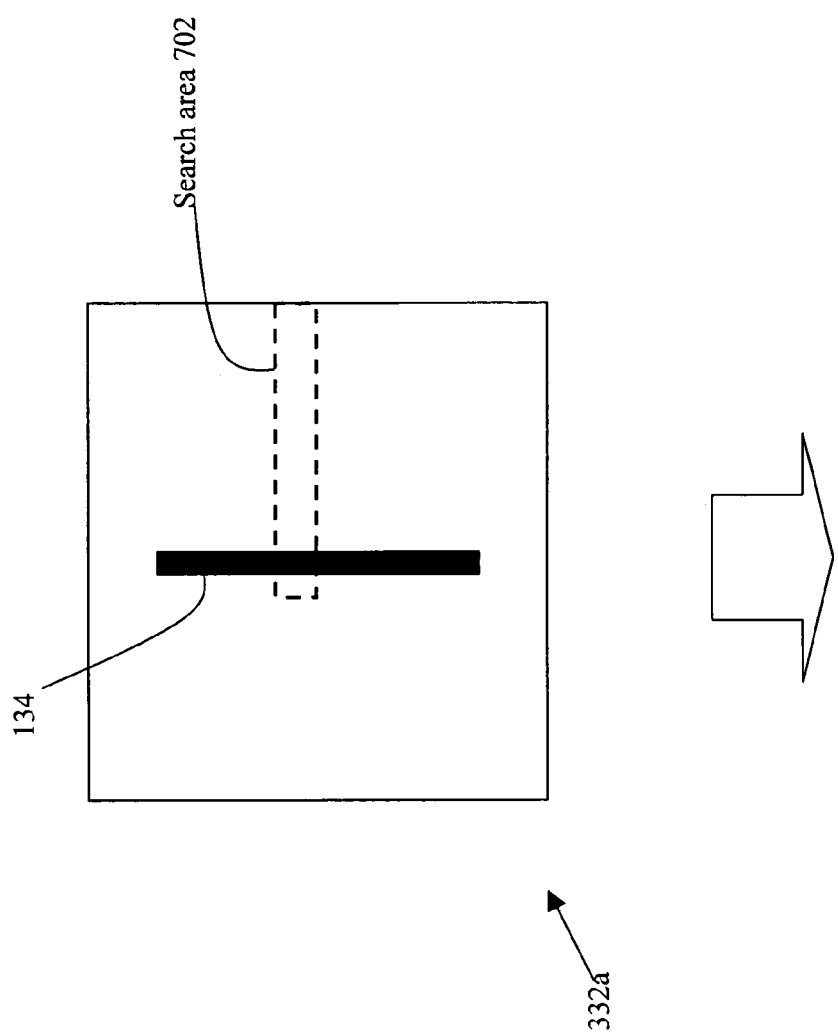

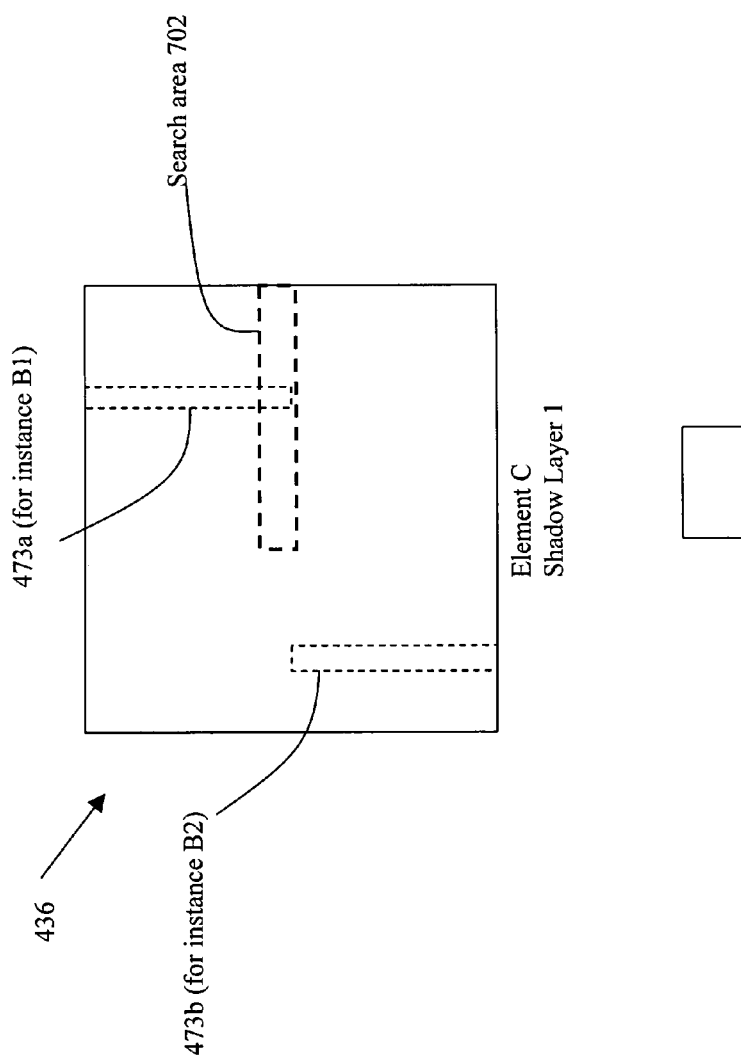

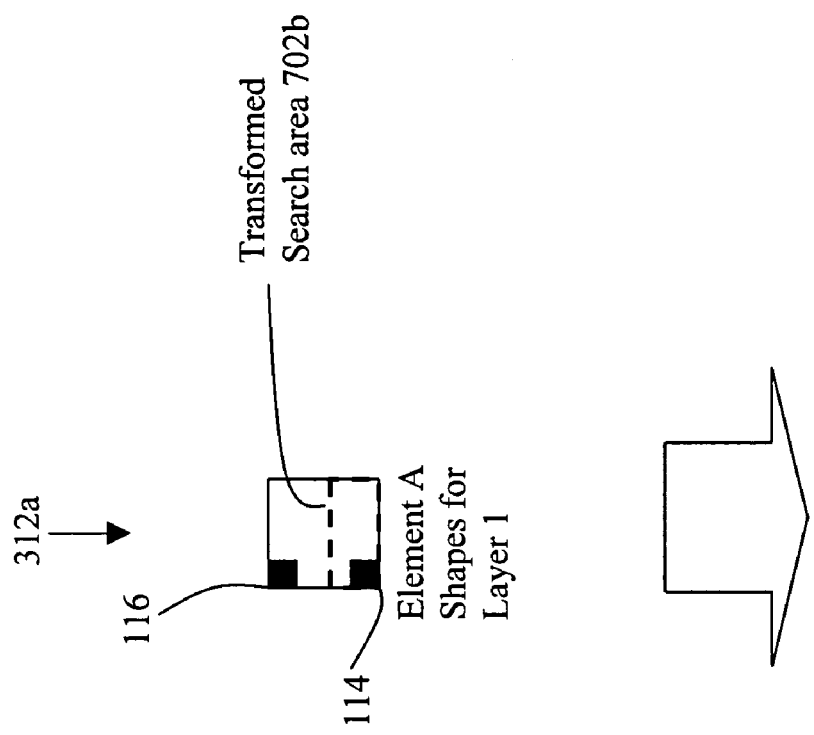

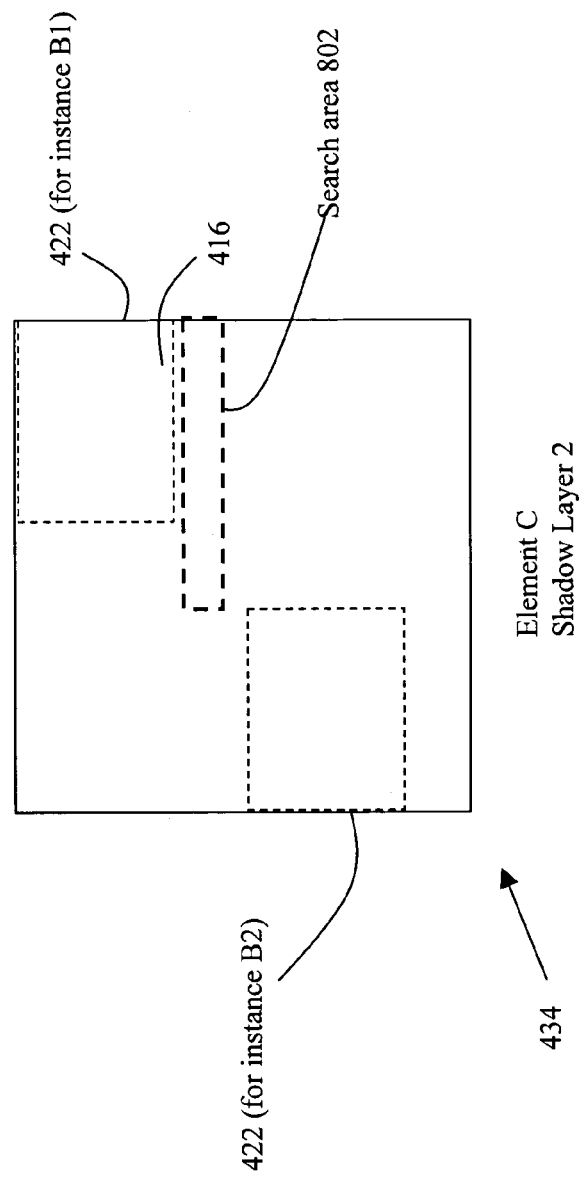

Example Design Hierarchy

Flattened Design Hierarchy

Select Object 1316 of Element C as seed object

Identify objects connected to Object 1316 of Element C

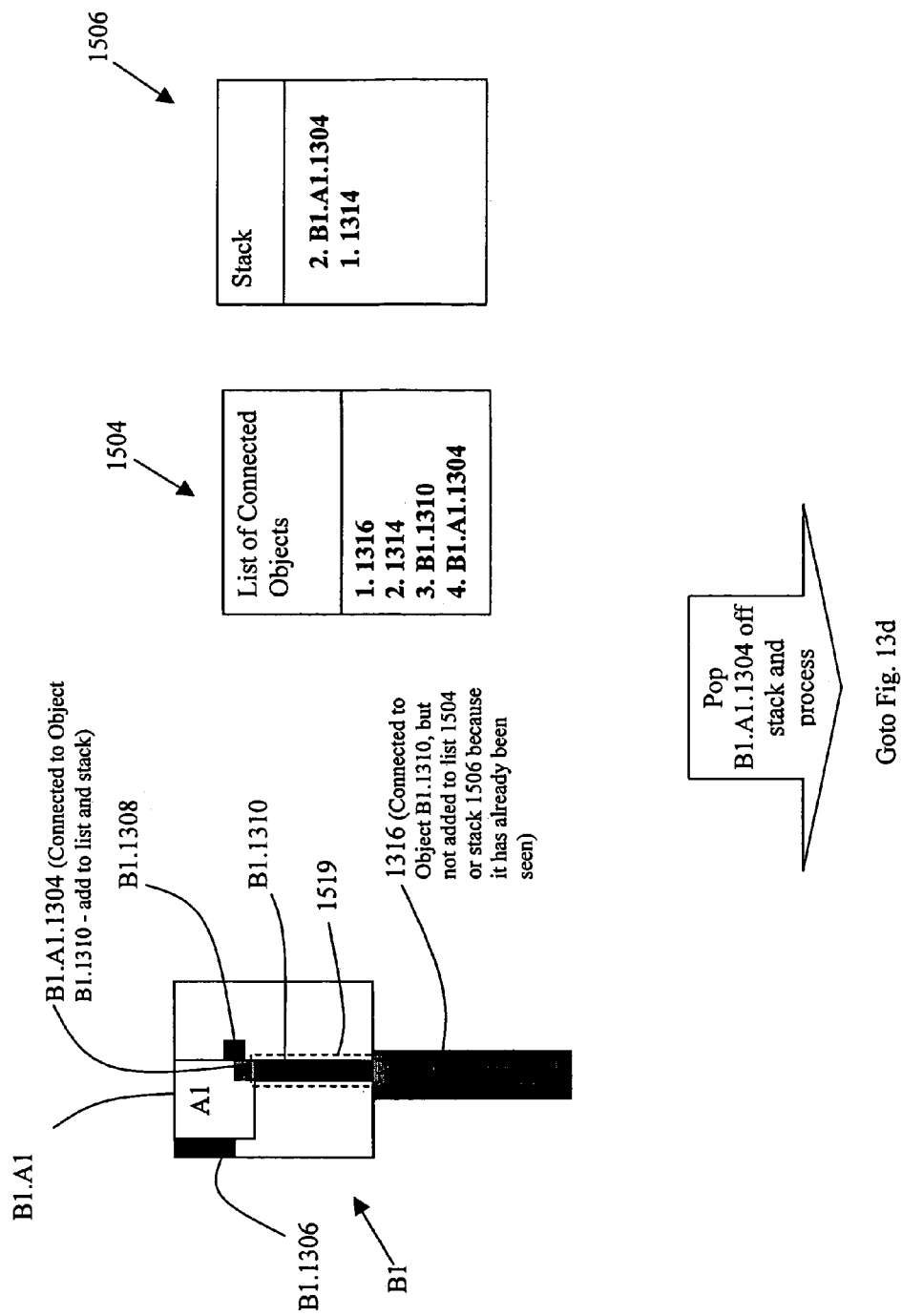

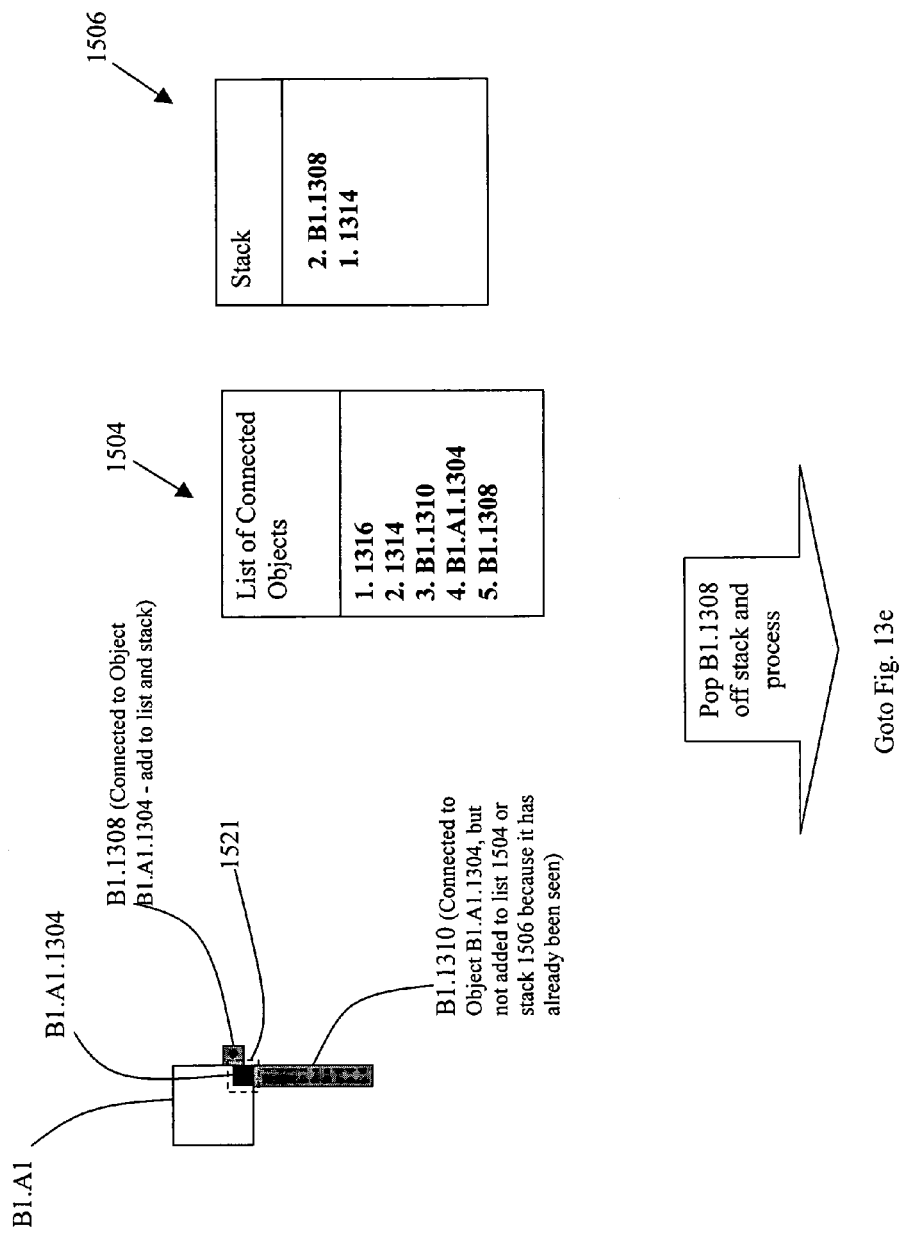

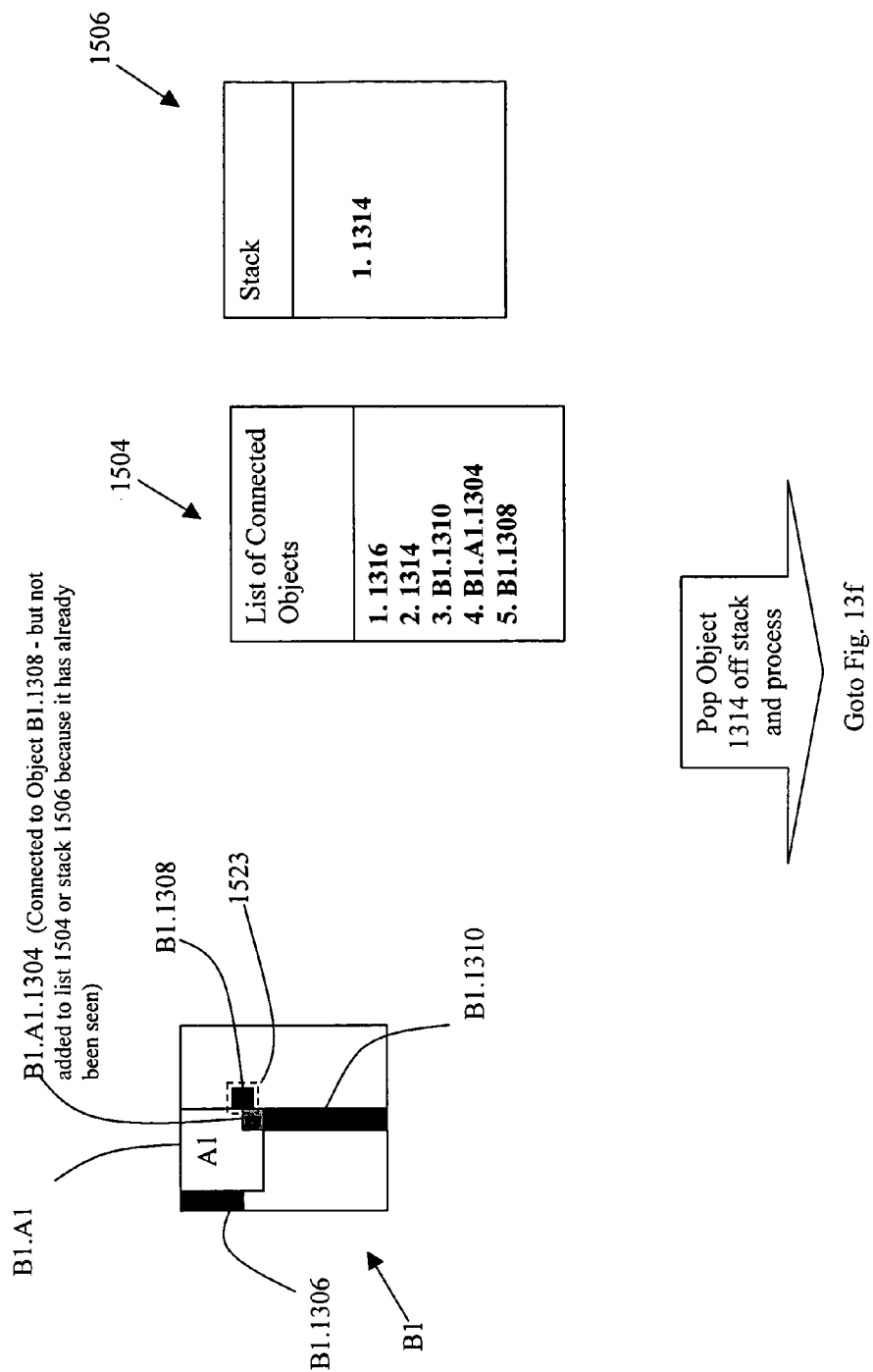

Connectivity Extraction for Shape
1304 of Element A

METHOD AND MECHANISM FOR DETERMINING SHAPE CONNECTIVITY

CROSS-REFERENCE TO RELATED APPLICATIONS

The present applications claims the benefit of U.S. Provisional Application Ser. No. 60/611,071, filed on Sep. 16, 2004, which is hereby incorporated by reference in its entirety.

The present application is related to co-pending U.S. application Ser. No. 11/229,320, filed on even date herewith, entitled "METHOD AND MECHANISM FOR IDENTIFYING AND TRACKING SHAPE CONNECTIVITY", which is hereby incorporated by reference in its entirety.

FIELD OF THE INVENTION

The present invention relates generally to electronic circuit design and manufacturing.

BACKGROUND OF THE INVENTION

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

Geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

IC layouts are often constructed in a hierarchical fashion, in which a master version or occurrence of a particular geometric element is created once, but where one or more instances of the geometric element may be inserted into various locations and levels within the IC design. In this type of approach, the IC layout is hierarchically set out by re-using elements over and over again. Rather than copying duplicates of the same geometric element everywhere that it is used, instances of the elements are inserted in the appropriate locations that logically reference the appropriate master occurrence or version.

FIG. 1A shows an example design hierarchy, in which an occurrence 112 of element A comprises three shapes 114, 116, and 118. As used herein, occurrence is a master or reference copy of an element and an instance is an instantiation of an occurrence. At a different level in the IC design, an occurrence 122 of element B may be created that includes its own shapes 124 and 125, as well as two instances 126 and 128 of element A. At yet another level of the IC design, an occurrence 132 for element C may be created that includes a shape 134 as well as two instances 136 and 138 of element B. Instances 136 and 138 each contain instances of element A as shown in occurrence 122 (which are "nested instances"). In the hierarchy of FIG. 1A, each instance provides a logical reference to its master occurrence rather than a physical manifestation of the occurrence at the instance locations. Assume that shapes 114, 116, and 134 are on layer 1 of the design and shapes 118, 124, and 125 are on layer 2 of the design. FIG. 1B shows the shapes that would be present on layer 1 for these portions of the design and FIG. 1C shows the shapes that would be present on layer 2.

An advantage of this approach is improved efficiency with respect to memory usage when storing design data for an IC design. Memory efficiencies are gained since instances of an element are used and placed in the design, rather than requiring a full copy of that element to be duplicated numerous times in the design data.

However, the hierarchical nature of this approach can also cause inefficiencies when attempting to access the design data. As just one example, consider the process to search a portion of the IC design for the shapes within a particular search area. The search area may encompass parts of one or more instances in the design. However, only a subset of the shapes within the instances may actually fall within the search area. Because the shapes are not actually stored at each level, the search process may need to traverse the entire hierarchy of the corresponding instances on every layer and their nested instances to confirm which shapes in the instances relate to the search area, even through portions of the hierarchy that do not contain any shapes at the correct layer or design area. Depending upon the complexity of the design, this could be a very lengthy and expensive process.

In an alternate approach, the design hierarchy can be flattened so that the design data is not hierarchical in nature. In this approach, rather than inserting instances of elements into the design, actual copies of the elements are placed in the appropriate locations within the design data. FIG. 2 shows a flattened version of the design data shown in FIG. 1. Here, occurrence 122a for a flattened element B includes copies 126a and 128a of element A 112, rather than the instances 126 and 128 of element A shown in FIG. 1 that refers back to the master copy 112. Similarly, occurrence 132a for a flattened element C includes copies 136a and 138a of element B 122a, rather than instances that refer back to the master copy. The advantage of this approach is that it is very efficient to search the flattened design data, since chains of instances do not need to be followed to identify shapes within a search area. However, if the design includes a large number of geometric elements, then this approach may also consume an excessive amount of memory and storage resources.

A useful function for EDA software is to identify all shapes that may be connected to an initially identified shape. The connected shapes may be on the same hierarchical level layer of a design or on different hierarchical levels. The connected shapes may be on the same layer of a design or on different layers connected through vias.

In traditional EDA systems, these operations for identifying and tracking connected shapes require the IC design to be a flat design. In part, this is because traditional approaches need the design to be flat to allow efficient identification of shapes that geometrically overlap with each other. If the design is originally in a hierarchical format, then the design must be flattened/unfolded before performing the operations to extract or verify the sets of connected shapes. One possible drawback of this traditional approach is that if the design includes a large number of geometric elements, then working with an unfolded design may also consume an excessive amount of memory and storage resources to store numerous copies of the exact same design elements/shapes, which could negatively affect the performance and usability of the system. Moreover, if the design is originally in a hierarchical format, then the process of flattening the entire design could itself be excessively expensive and delay the overall results.

Therefore, it is desirable to implement an improved method and mechanism for identifying and verifying connected shapes in the hierarchical design for an integrated circuit that address these drawbacks of the traditional approaches. In particular, it is desirable to have a method and mechanism for identifying connected shapes in a hierarchical design which do not require the entire hierarchical design to be fully flattened.

SUMMARY

A method and system is provided for identifying and tracking nets in a hierarchical design without requiring the hierarchical design to be flattened. The entire hierarchical design does not have to be flattened to perform the operation of identifying connected objects for a specific object. Instead of unfolding the entire design hierarchy, only the specific instances of shapes falling within the geometric bounds of shapes need to be unfolded to perform the search. Other and additional objects, features, and advantages of the invention are described in the detailed description, figures, and claims.

BRIEF DESCRIPTION OF THE DRAWINGS

The drawings illustrate the design and utility of embodiments of the present invention, in which similar elements are referred to by common reference numerals. In order to better appreciate the advantages and objects of a preferred embodiment, reference should be made to the accompanying drawings that illustrate this preferred embodiment. However, the drawings depict only one embodiment of the invention, and should not be taken as limiting its scope.

FIGS. 1A-C shows an example design hierarchy.

FIGS. 3A-B illustrate examples of information stored in a shape tree according to one embodiment of the invention.

FIGS. 4, 5A-C, and 6A-C illustrate an embodiment of a process for determining shadow boundaries and shadow trees.

FIG. 7 is a flowchart of a process for searching an area of a layer of a design according to an embodiment of the invention.

FIGS. 8A-G and 9A-C illustrate an example process for searching an area of a layer of a design according to an embodiment of the invention.

FIGS. 13a-f illustrate an example process for connectivity identification according to an embodiment of the invention.

DETAILED DESCRIPTION

The present invention is directed to a method and mechanism for identifying and tracking nets in an electrical design. In one embodiment, a hierarchical design does not have to be flattened to perform the operation of identifying and tracking nets. To identify sets of connected shapes, instead of having to unfold the entire design hierarchy, only the specific instances of shapes falling within the geometric bounds of shapes identified as being part of a net needs to be unfolded to perform the search. When composing the list of nets for a hierarchical design, the unfolded shapes at other hierarchical levels of the design can be derived based upon virtual terminal structures that implicitly references nets and objects at other levels. In one embodiment, the hierarchical design is structured to have multiple layers includes, for each layer, storing a plurality of shape occurrences for the layer, in which a hierarchy of shape instances has a plurality of levels. Each shape instance corresponds to one of the shape occurrences. A hierarchy of shadow instances has a plurality of levels.

Shape Abstraction

It is useful at this point to describe an example approach for storing and processing a hierarchical structure for an electrical design. This example hierarchical approach will be used later to illustrate the disclosed embodiment of the method and mechanism for extracting and tracking connectivity in a design. It is noted, however, that the described approach for identifying and tracking connectivity in a design may be employed with many hierarchical formats, and thus is not to be limited to the specific hierarchical format described in this section.

In one embodiment, the hierarchical format comprises a set of structures (referred to herein as "shape abstraction data structures") in which a hierarchical design structure is maintained but which provides many advantages of a flattened design. In this embodiment, the shape abstraction data structures store geometric information for shapes in each layer of the design and track the boundaries of shape instances ("shadows") at each layer. The shapes are tracked for each occurrence for each layer of the design. Any suitable data structure may be employed to track the shapes, e.g., using a tree structure, list structure, etc. As used herein, the term "shape tree" refers to a data structure for tracking the shapes on a layer for an occurrence.

Figure 1C:
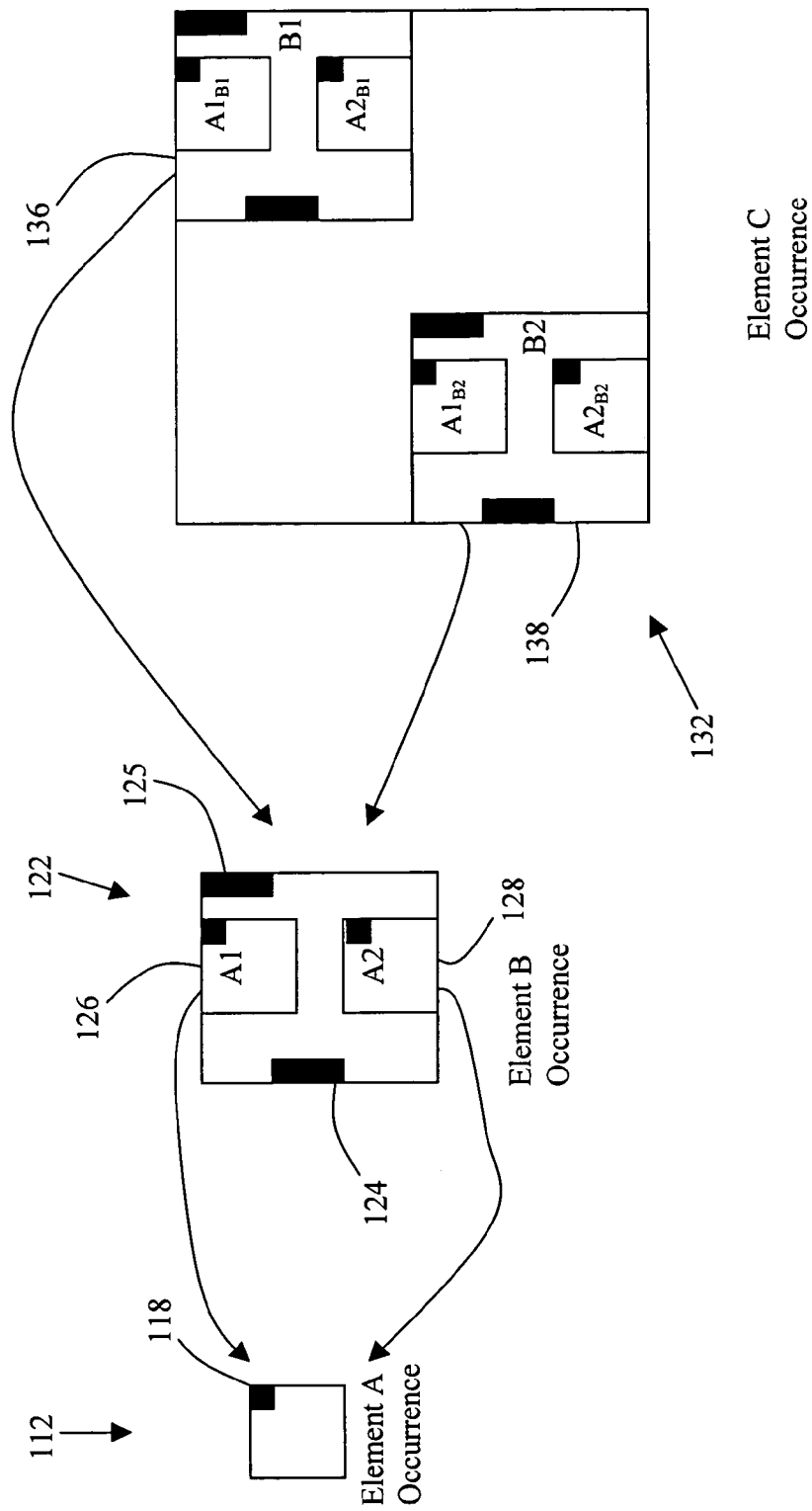
Figure 2:
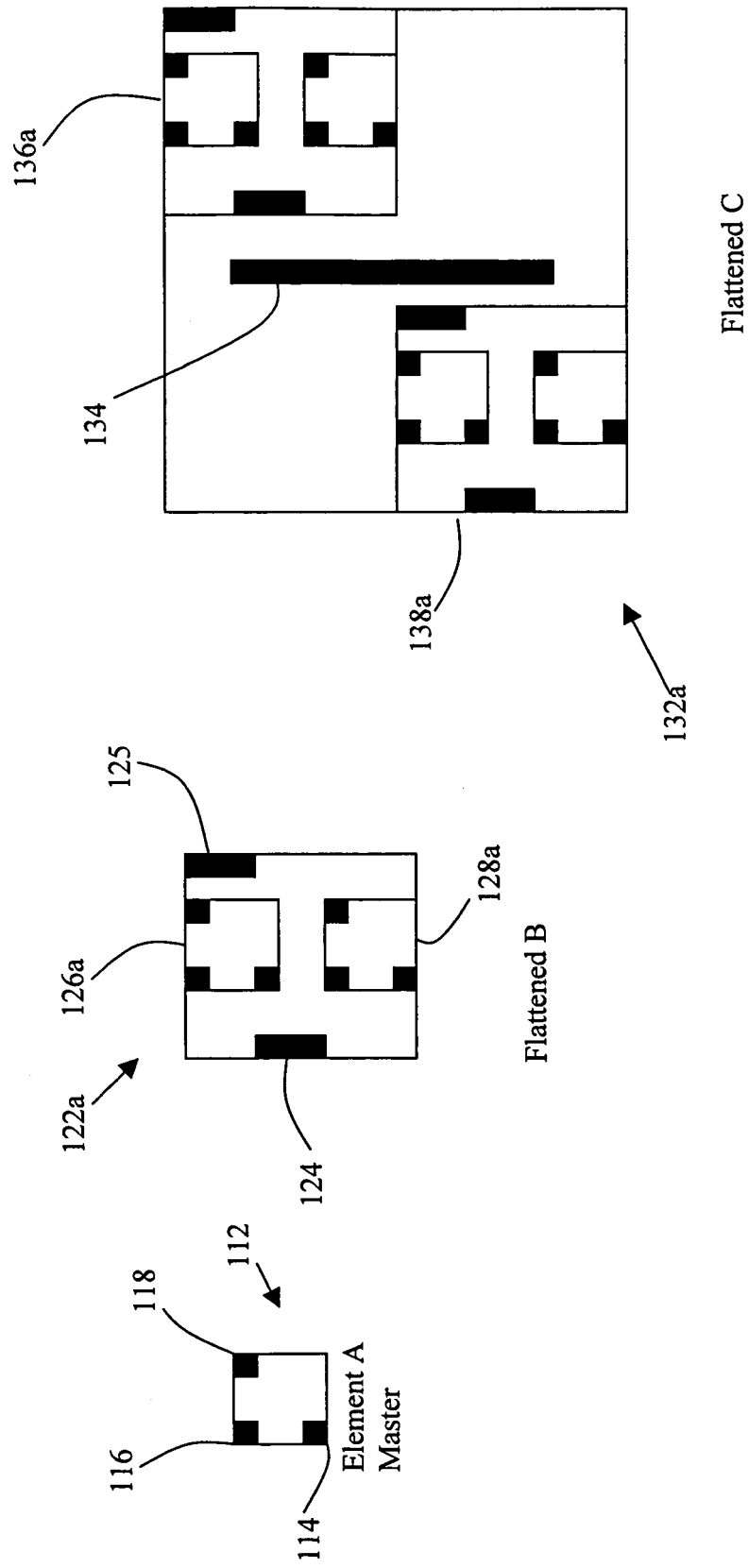
FIG. 2 shows an example of a flattened design hierarchy.

To illustrate and explain the present approach, reference will be made to the design hierarchy of FIG. 1A. Recall that FIG. 1A shows an example design hierarchy, in which an occurrence 112 of element A comprises three shapes 114, 116, and 118. At a different level in the IC design, an occurrence 122 of element B may be created that includes its own shapes 124 and 125, as well as two instances 126 and 128 of element A. At yet another level of the IC design, an occurrence 132 for element C may be created that includes a shape 134 as well as two instances 136 and 138 of element B. It is assumed that shapes 114, 116, and 134 are on layer 1 of the design and shapes 118, 124, and 125 are on layer 2 of the design. FIG. 1B shows the shapes that would be present on layer 1 for these portions of the design and FIG. 1C shows the shapes that would be present on layer 2. Each instance in the instance hierarchy points to a master data structure of the corresponding occurrence for the shape. The master data structure contains data, such as the bounds for the shape.

A first set of structures in the shape abstraction data structures is referred to herein as the shape trees, which track the native shapes on each layer for each geometric element. In the present embodiment, a separate shape tree is maintained for each occurrence for each layer. However, as is evident to those skilled in the art, other organizations of the data can also be used to implement the shape trees.

FIG. 3A illustrates the contents of the shape trees for layer 1 of the design hierarchy of FIG. 1A. Shape tree 312a tracks the shapes on layer 1 for element A, illustrating that element A includes shapes 114 and 116 on layer 1 at the indicated locations. Shape tree 322a tracks the shapes on layer 1 for element B, illustrating that element B does not have any native shapes on layer 1. Shape tree 332a tracks the shapes on layer 1 for element C, illustrating that element C includes a shape 134 on layer 1 at the indicated location.

FIG. 3B illustrates the contents of the shape trees for layer 2 of the design hierarchy of FIG. 1A. Shape tree 312b tracks the shapes on layer 2 for element A, illustrating that element A includes shape 118 on layer 2 at the indicated location. Shape tree 322b tracks the shapes on layer 2 for element B, illustrating that element B includes shapes 124 and 125 on layer 2 at the indicated locations. Shape tree 332b tracks the shapes on layer 2 for element C, illustrating that element C does not have any native shapes on layer 2.

Another set of structures (referred to herein as "shadow trees") is maintained to track the boundaries of the shape for instances ("shadows") at each layer. Each instance refers to a master structure that may include one or more shapes on one or more layers of the design. The shadow trees provide a structure that tracks the identity and location for the boundaries of the shapes referred to by instances in the design. Any suitable data structure may be used to track the information in the shadow trees, such as tree structures and list structures. In the present embodiment, a separate shadow tree is maintained for each occurrence for each layer. However, as is evident to those skilled in the art, other organizations of the data can also be used to implement the shadow trees.

The shadow tree for an occurrence on a layer is determined by identifying a "shadow" for shapes in the appropriate layer for the top-level instances in the element. Each top-level instance having shapes at the appropriate layer is associated with its own shadow. Each top-level instance may have its own nested instances. The boundary of the shadow for the instance is determined by performing a union of the coverage area for all shapes at the appropriate layer for that top-level instance with the coverage area of shapes at the layer in its nested instances.

Referring to FIG. 4, shown are the contents of shadow trees that may be created for element A. The shapes in instances for element A at layer 1 would be represented in a layer 1 shadow tree 401 and the shapes in instances A at layer 2 would be represented in a layer 2 shadow tree 403. Here, since element A does not contain any instances, there are no instance shadows, at either layer 1 or layer 2, to populate the shadow trees for element A. Therefore, no shadows exist in shadow trees 401 and 403 for element A.

FIG. 5A illustrates the presently embodied process for forming shadow trees for occurrence 122 of element B. Occurrence 122 for element B includes two instances A1 126 and A2 128 of element A. The shadow trees for element B contain a shadow for each instance that contains shapes at the appropriate layer of the design. Each shadow tracks the boundaries of the shapes in the instance, and shapes in its nested instances, that exist on the appropriate layer of the design.

Shadow tree 430 tracks the boundaries of shapes on layer 1 for instances of element B. Here, shadow tree 430 contains a first shadow 412a corresponding to instance A1 and a second shadow 412b corresponding to instance A2.

FIG. 5B illustrates an embodiment of a process for determining the boundaries and locations of the shadows 412a and 412b for the shapes of instances of element A at layer 2. The first action is to identify the native shapes for element A that exist on layer 1 of each instance. For this example, shapes 114 and 116 have been identified as being on layer 1 of element A (see FIG. 1B). A boundary is drawn around the identified shapes on the layer. In one embodiment, the boundary is a rectangle that is sized to fit around the boundary of all the identified shapes on the layer. Here, boundary 410 is a rectangular shape that matches and encompasses the outer boundaries of all the identified shapes 114 and 116 for element A on layer 1. Since shapes 114 and 116 are separated by a certain distance, the boundary 410 may encompass additional area within the geometric element. Next, identification is made of a boundary for all shapes for layer 1 within nested instances of element A. To identify the boundaries of the final shadow 412 for instances of element A, a union is performed between the boundary 410 of the native shapes in element A and the boundary of the shapes for nested instances within element A. Here, element A does not have any nested instances. Therefore, the coverage area and relative location of boundary 410 for the native shapes 114 and 116 in element A form the shadow 412 for element A on layer 1.

Shadow 412 is duplicated as shadow 412a in shadow tree 430 of FIG. 5A at a location relative to its positioning within instance A1. In like manner, shadow 412 is also duplicated as shadow 412b in shadow tree 430 at a location relative to its positioning within instance A2.

Shadow tree 432 in FIG. 5A tracks the boundaries of shapes on layer 2 for instances of element B. Here, shadow tree 432 contains a first shadow 416a corresponding to instance A1 and a second shadow 416b corresponding to instance A2.

Figure 5C:
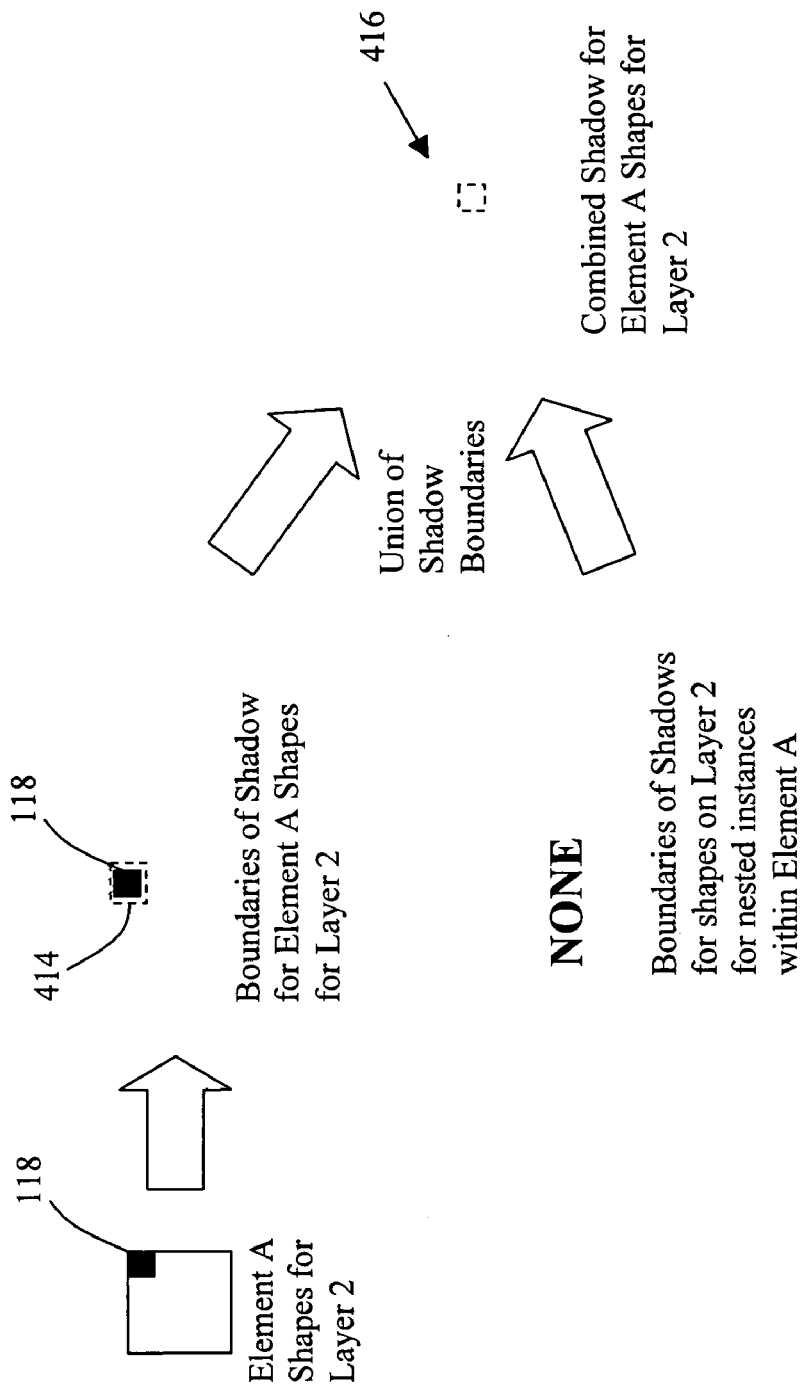

FIG. 5C illustrates an embodiment of a process for determining the boundaries and locations of the shadows 416a and 416b for the shapes of instances of element A at layer 2. The first action is to identify the native shapes for element A that exist on layer 2 of each instance A1 and A2. Here, only shape 118 of element A has been identified as being on layer 2 (See FIG. 1C). Therefore, the boundary 414 that is drawn around native shapes at the top-level instance (i.e., shape 118) exactly matches the dimensions and relative location for shape 118 within element A. Next, identification is made of the boundary for all shapes on layer 2 within nested instances in element A, which will be combined with boundary 414 to form shadow 416. Here, element A does not have any nested instances. Therefore, the coverage area and relative location of boundary 414 for shape 118 forms the shadow 416 for element A on layer 2.

Shadow 416 is duplicated as shadow 416a in shadow tree 432 of FIG. 5A at a location relative to its positioning within instance A1. In like manner, shadow 416 is also duplicated as shadow 416b in shadow tree 432 at a location relative to its positioning within instance A2.

Figure 6A:
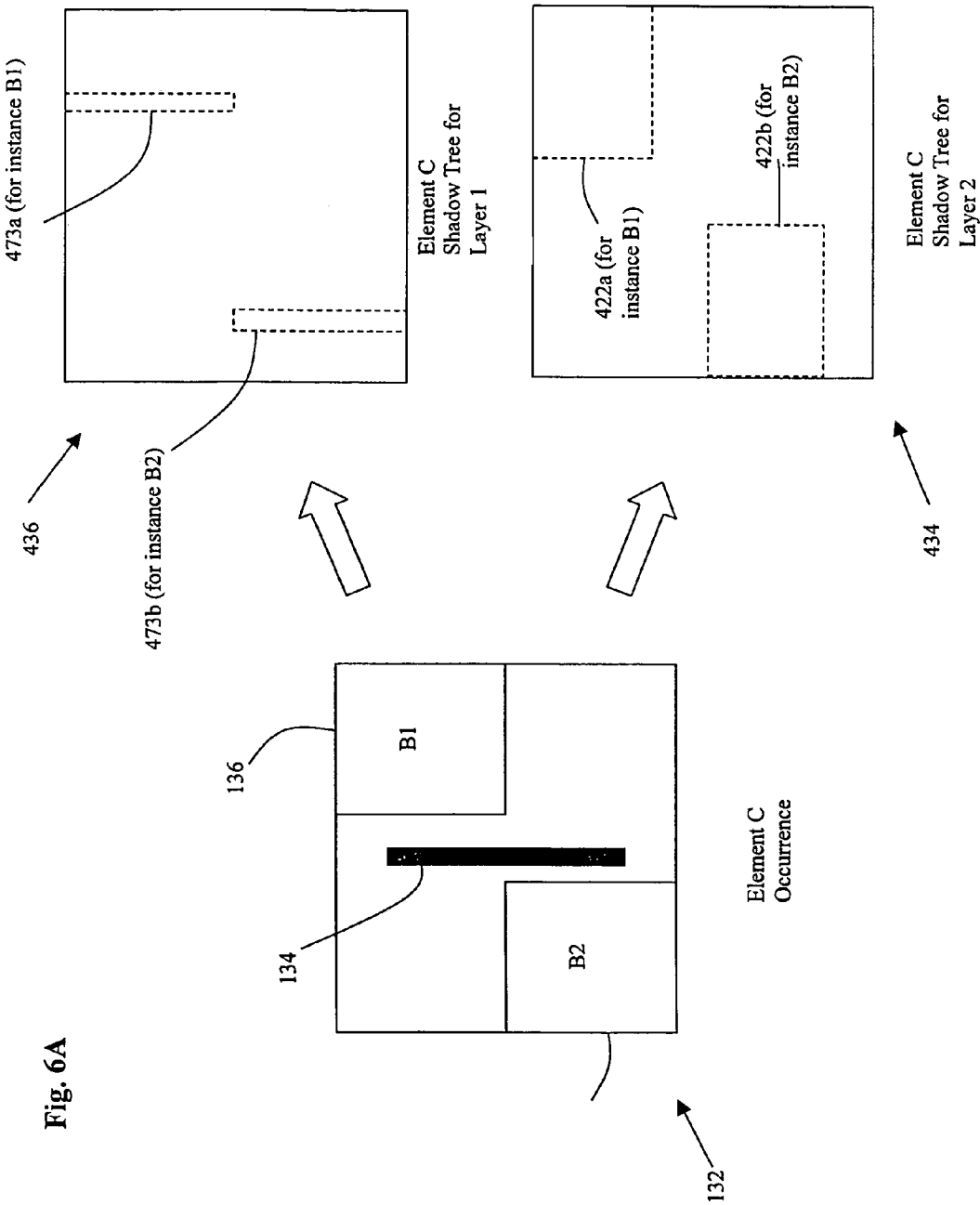

FIG. 6A illustrates the presently embodied process for forming shadow trees for occurrence 132 of element C. Occurrence 132 for element C includes two instances B1 136 and B2 138 of element B. The shadow trees for element C contain a shadow for each instance that contains shapes at the appropriate layer of the design. Each shadow tracks the boundaries of the shapes in the instance, and shapes in its nested instances, that exist on the appropriate layer of the design.

Shadow tree 436 tracks the boundaries of shapes on layer 1 for instances of element C. Here, shadow tree 436 contains a first shadow 473a corresponding to instance B1 and a second shadow 473b corresponding to instance B2.

Figure 6B:
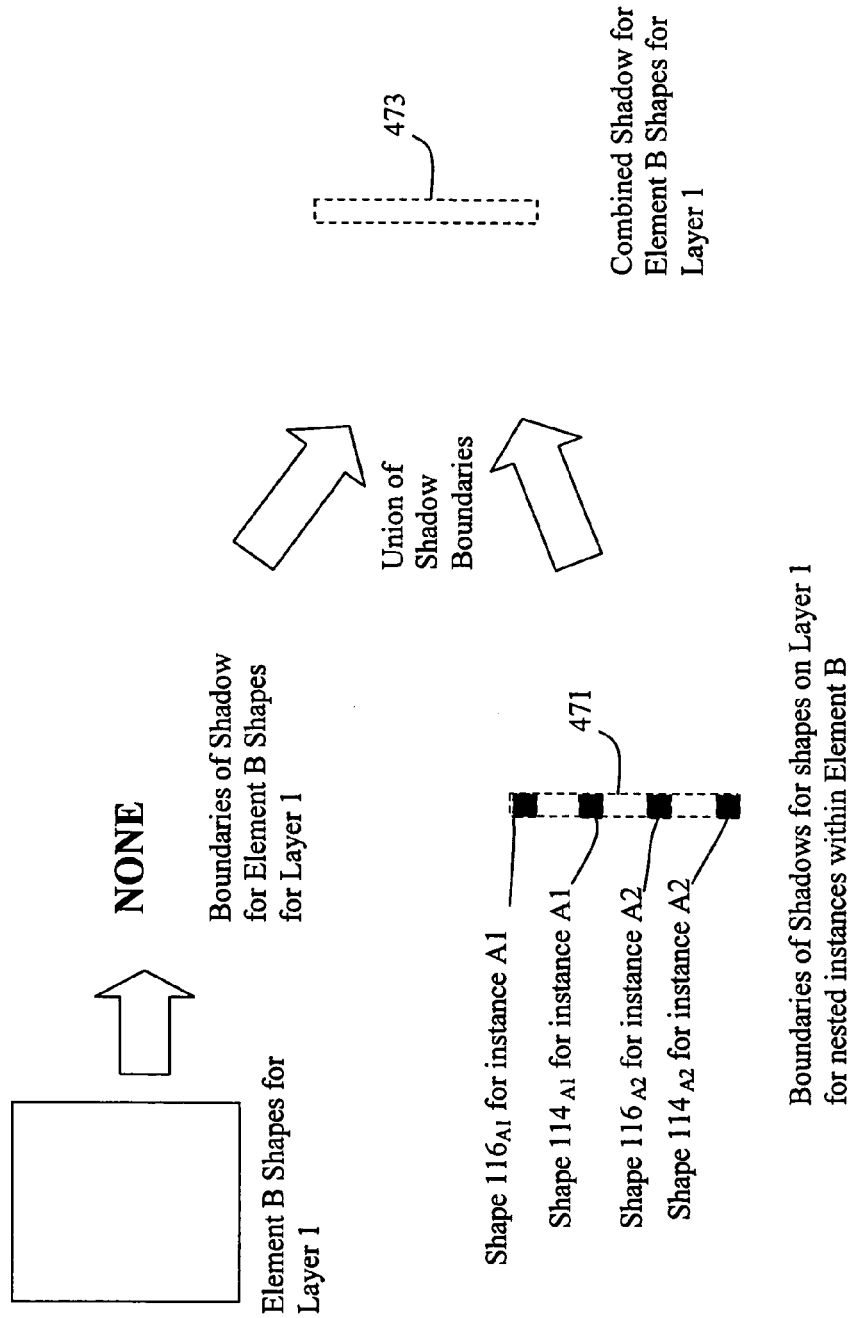

FIG. 6B illustrates an embodiment of a process for determining the boundaries and locations of the shadows 473a and 473b for the shapes of instances of element B at layer 1. The first action is to identify the native shapes for element B that exist on layer 1 of each instance. In this example, there are no native shapes for instances of element B on layer 1 (See FIG. 1B). Therefore, a shadow does not exist for native shapes for instances of element B on layer 1. Next, identification is made of the boundary for shapes on layer 1 for nested instances within instances of element B. Here, element B includes two instances of element A (element A1 and A2). Each instance A1 and A2 includes a shape 114 and a shape 116 on layer 1. Therefore, a boundary 471 exists for all the shapes $114_{A1}$, $116_{A1}$, $114_{A2}$, and $116_{A2}$ for nested instances A1 and A2. As before, the boundary can be drawn as a rectangle that is sized to fit around the outer boundaries of all the identified shapes, even if the boundary includes open area between the shapes. The shadow 473 for layer 1 of element B is formed from a union of the boundary for the native shapes and the boundary 471 for the shapes at layer 1 of nested instances. Here, since element B does not have any shapes on layer 1, the coverage area and relative location of boundary 471 for the nested instances form the shadow 473 for element B on layer 1.

Shadow 473 is duplicated as shadow 473a in shadow tree 436 of FIG. 6A at a location relative to its positioning within instance B1. In like manner, shadow 473 is also duplicated as shadow 473b in shadow tree 436 at a location relative to its positioning within instance B2.

Shadow tree 434 tracks the boundaries of shapes on layer 2 for instances of element C. Here, shadow tree 434 contains a first shadow 422a corresponding to instance B1 and a second shadow 422b corresponding to instance B2.

Figure 6C:
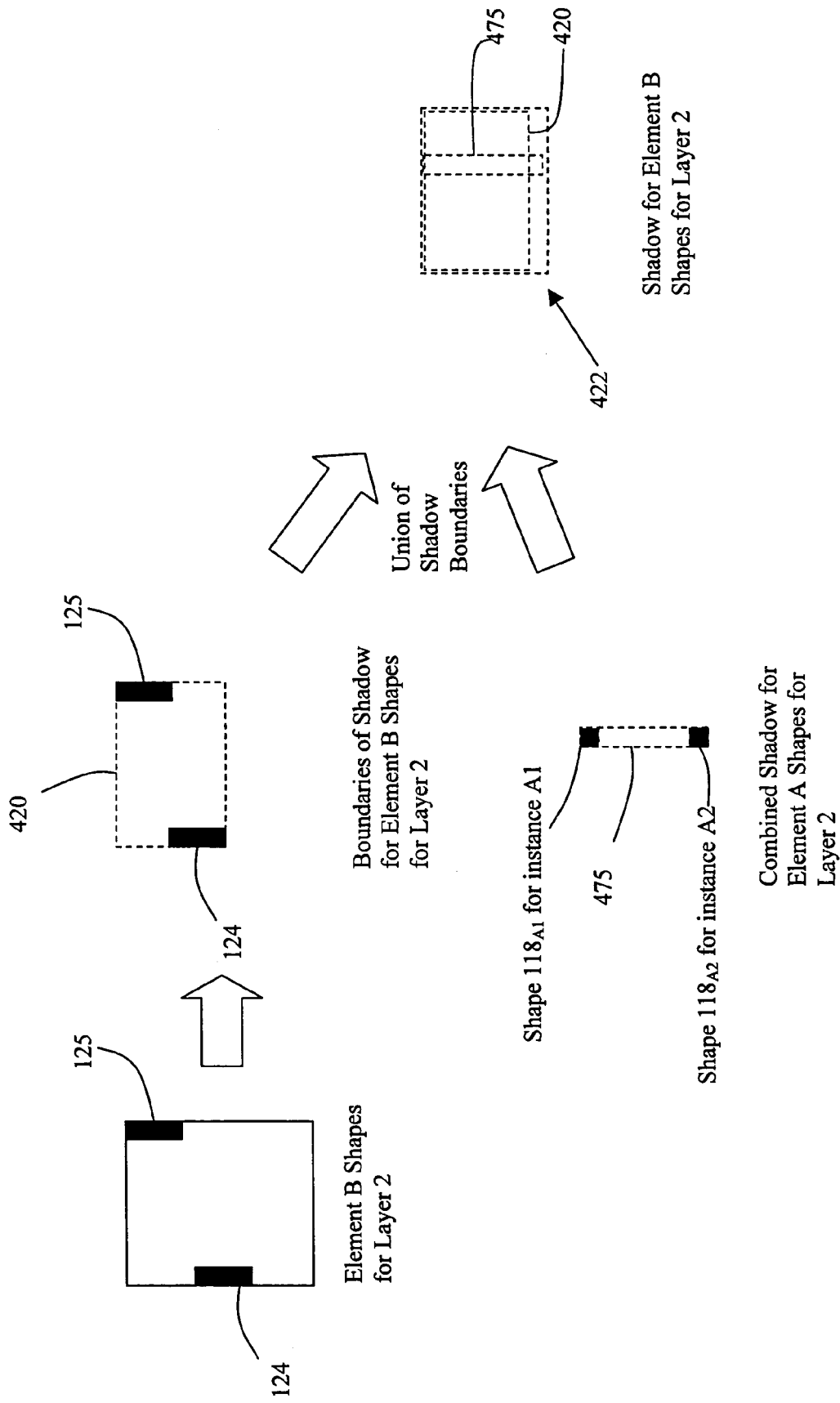

FIG. 6C illustrates an embodiment of a process for determining the boundaries and locations of the shadows 422a and 422b for the shapes of instances of element B at layer 2. The first action is to identify the native shapes for element B that exist on layer 2 of each instance B1 and B2. Shapes 124 and 125 have been identified as natively being on layer 2 of instances of element B. A boundary 420 is drawn around the identified shapes 124 and 125 on the layer. Here, boundary 420 is a rectangular shape that matches and encompasses the outer boundaries of all the identified shapes 124 and 125 for element B on layer 2. Since a distance separates shapes 124 and 125, the boundary 420 encompasses additional area within the geometric elements of the two shapes.

Next, identification is made of the boundary for shapes on layer 2 for nested instances within element B. Here, element B includes two instances of element A (element A1 and A2). Each instance A1 and A2 includes a shape 118 on layer 2. Therefore, a shadow boundary 475 exists surrounding the outer boundaries of shapes $118_{A1}$ and $118_{A2}$ for nested instances A1 and A2.

The shadow 422 for layer 2 shapes of element B is defined from a union of the boundary 420 for the native shapes and the boundary 475 for the shapes of nested instances within layer 2. As before, the boundary can be drawn as a rectangle that is sized to fit around the outer boundaries of all the identified shapes, even if the boundary includes open area between or around the shapes. Shadow 422 is duplicated as shadow 422a in shadow tree 434 of FIG. 6A at a location relative to its positioning within instance B1. In like manner, shadow 422 is also duplicated as shadow 422b in shadow tree 434 at a location relative to its positioning within instance B2.

FIG. 7 shows a flowchart of an embodiment of a method to identify or search for objects within a layer of a design when using the disclosed shape abstraction data structures. A desired region or area of a given layer to be searched is defined (602). Shapes within or intersecting with the search area on the desired level are identified. In one approach, this is performed by searching the appropriate shape tree for the object or area being searched (604). A determination is made whether any shapes exist within or intersect with the search area (606). If so, then the identified shapes are reported as being within the search area (608). One exemplary approach for identifying geometric objects within a given search area is described in co-pending U.S. application Ser. No. 10/342,823, entitled, "Zone Tree Method and Mechanism", filed on Jan. 14, 2003, which is hereby incorporated by reference in its entirety.

Next, the shapes for instances within the search area are identified. In one approach, this is performed by searching the appropriate shadow tree for the object or area being searched (610). A determination is made whether any shadows exist within or intersect with the search area (612). If so, then identification is made of the master structure(s) for the identified shadow(s) (614). The search area is re-defined to cover the corresponding portions of each identified master structure (616). For each identified master, the process recursively returns back to 604 to identify shapes associated within the re-defined search area of the master (618).

Figure 8D:
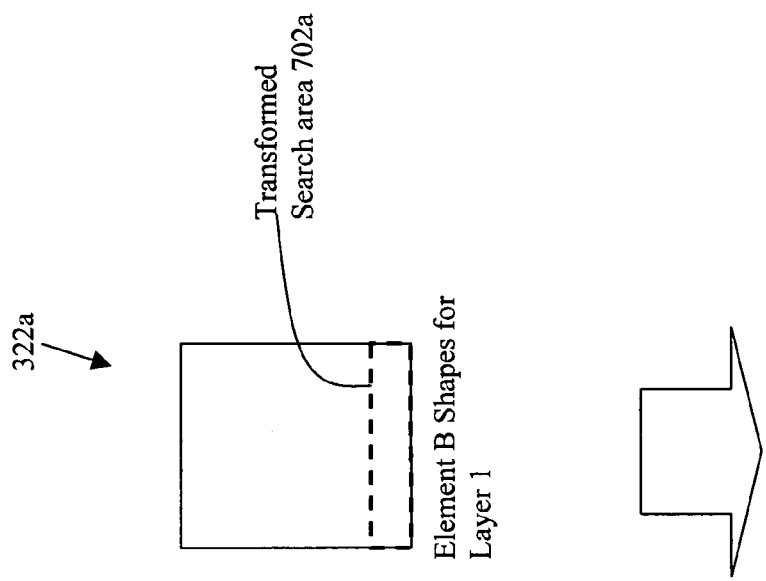

FIGS. 8A-G illustrate an example of this process for identifying objects within a search area. FIG. 8A shows a search area 702 that has been defined for layer 1 to search for shapes within element C. A search of the shape tree is performed. To depict a search of the shape tree, FIG. 8B shows the search area 702 overlaid on the shape tree 332a (FIG. 3A) for layer 1 of element C. Here, it can be seen that shape 134 intersects with the boundaries of search area 702. Therefore, the process reports shape 134 as being within/intersecting with the search area.

Next, the shadow tree is searched with respect to the search area 702. Referring to FIG. 8C, shown is the search area 702 overlaid onto the visualization of shadow tree 436 (FIG. 6A) for layer 1 of element C. Here, it can be seen that shadow 473a intersects with the boundaries of the search area 702.

The shadow 473a is identified as being associated with instance B1. Therefore, the next action is to transform the search area 702 relative to its corresponding portion of the master for instance B1, and then recursively perform a search for shapes within that re-defined search area 702a for the master structures for instance B1 at the appropriate layer.

A search of the shape tree 322a (FIG. 3A) for the master of instance B1 is performed. To depict a search of the shape tree, FIG. 8D shows the re-defined search area 702a overlaid on the shape tree 322a for layer 1 of element B. Here, it can be seen that no shapes exist in the shape tree 322a for element B within the re-defined search area 702a.

Figure 8E:
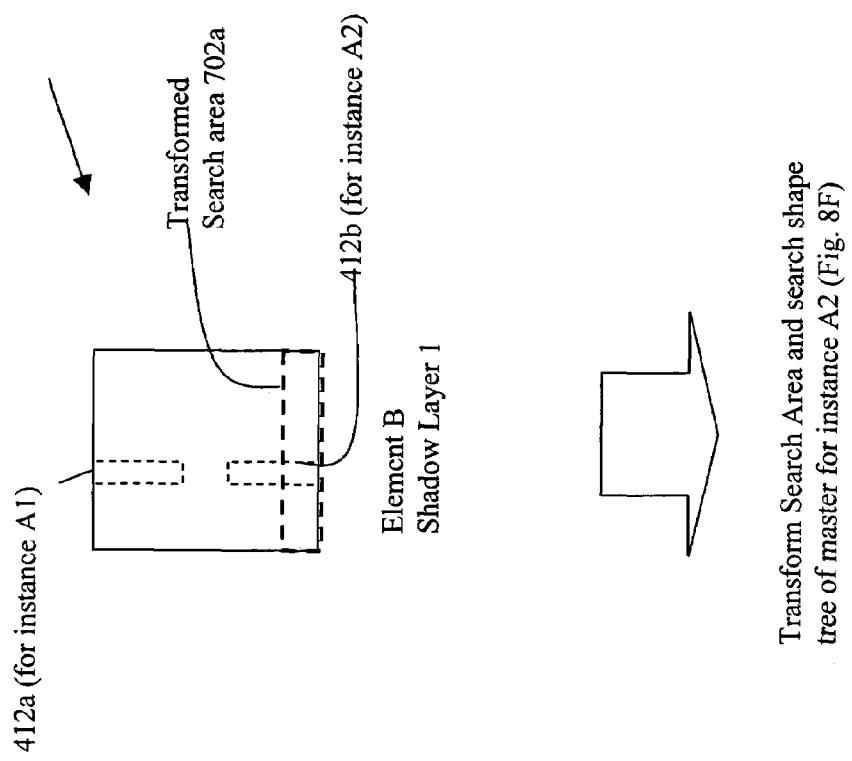

Next, the shadow tree for layer 1 of element B is searched with respect to the search area 702a. Referring to FIG. 8E, shown is the search area 702a overlaid onto the visualization of shadow tree 430 (FIG. 5A) for layer 1 of element B. Here, it can be seen that shadow 412b intersects with the boundaries of the search area 702a.

The shadow 412b is identified as being associated with instance A2 of element B. Therefore, the next action is to transform the search area 702a relative to its corresponding portion of the master for instance A2, and then recursively perform a search for shapes within that re-defined search area 702b for the master structures for instance A2 at the appropriate layer.

A search of the shape tree 312a (FIG. 3A) for the master of instance A2 is performed. To depict a search of the shape tree, FIG. 8F shows the re-defined search area 702b overlaid on the shape tree 312a for layer 1 of element A. Here, it can be seen that shape 114 falls within the boundaries of search area 702b. Therefore, the process reports shape 114 as being within/intersecting with the search area.

Figure 8G:
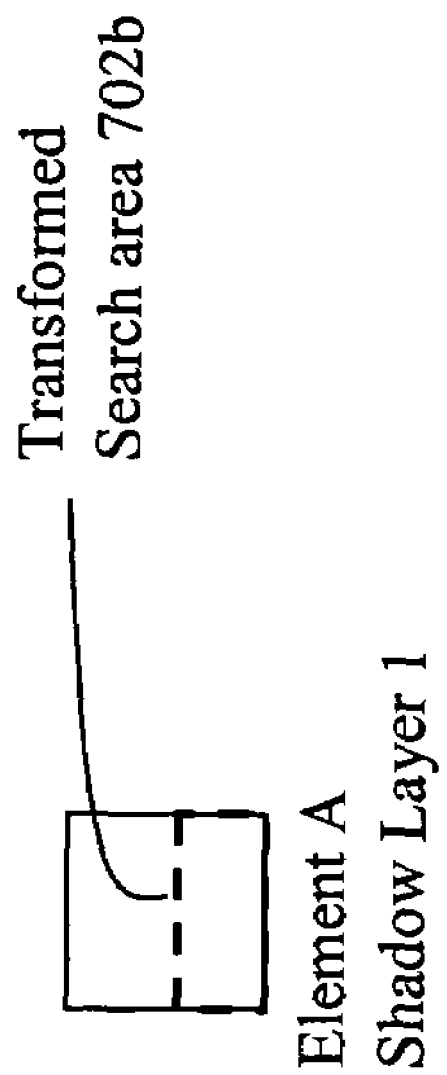

Next, the shadow tree for layer 1 of element A is searched with respect to the search area 702b. Referring to FIG. 8G, shown is the search area 702b overlaid onto the visualization of the shadow tree 401 (FIG. 4) for layer 1 of element B. Here, it can be seen that no shadows within shadow tree 401 intersect with the boundaries of the search area 702b. Therefore, the process ends unless additional recursive searches still need to be performed for shadows that have been previously identified.

Figure 9A:
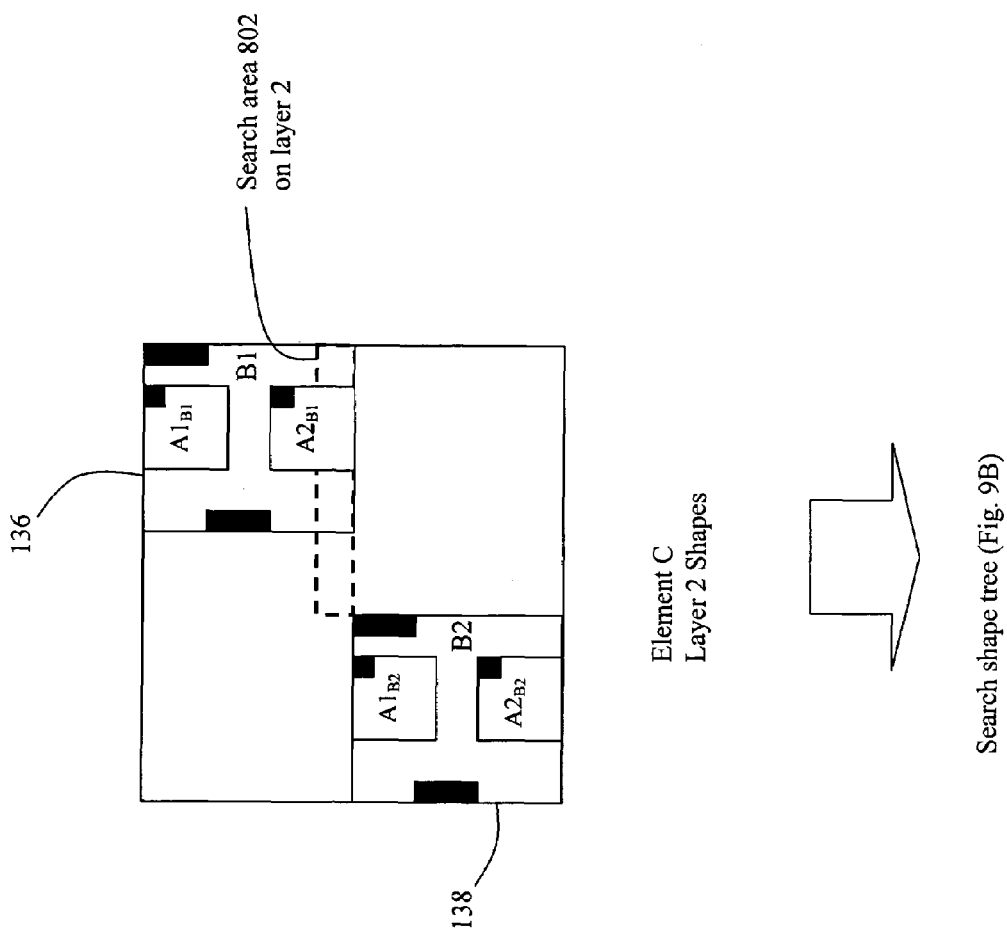
Figure 9B:
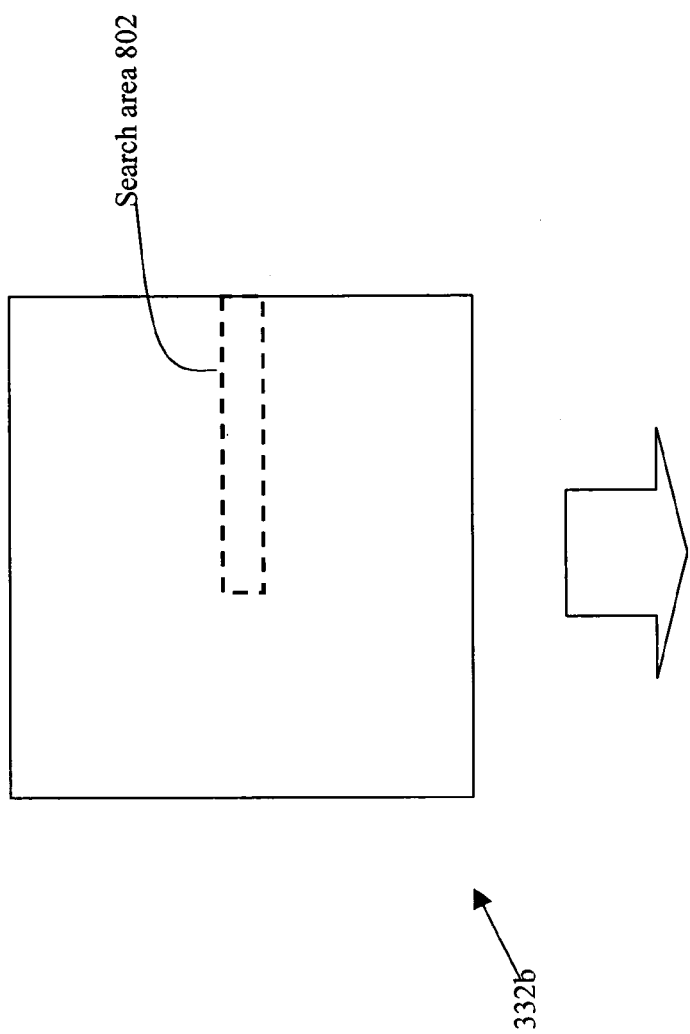

Next, assume that the search is for objects on layer 2 of geometric element C. FIG. 9A shows a search area 802 that has been defined for layer 2 to search for shapes within element C. A search of the appropriate shape tree is performed. To depict a search of the shape tree, FIG. 9B shows the search area 802 overlaid on the shape tree 332b (FIG. 3A) for layer 2 of element C. Here, it can be seen that the boundaries of search area 802 do not intersect any shapes within shape tree 332b. Therefore, the process does not report any shapes at this time.

The shadow tree for layer 2 is then searched with respect to the search area 802. Referring to FIG. 9C, shown is the search area 802 overlaid onto a visualization of the shadow tree 434 (FIG. 6A) for layer 2 of element. Here, it can be seen that no shadows within shadow tree 434 fall within or intersect the boundaries of the search area 802. Therefore, no shapes are reported as being within the search area on layer 2.

Note that this search area over layer 2 of element C does not return any found objects, despite the fact that the search area actually encompasses a portion of instance B1 136 (as can be seen on FIG. 9A). Because the shadow tree is configured to track only the actual boundaries of shapes for instances on the specified layer, and no shapes exist within the search area on layer 2 of element C, the search does not return any found objects. This highlights a significant advantage of the present embodiment of the invention, which can greatly reduce unnecessary searching of hierarchical elements that do not have shapes in the search area within the layer being searched.

Figure 10:
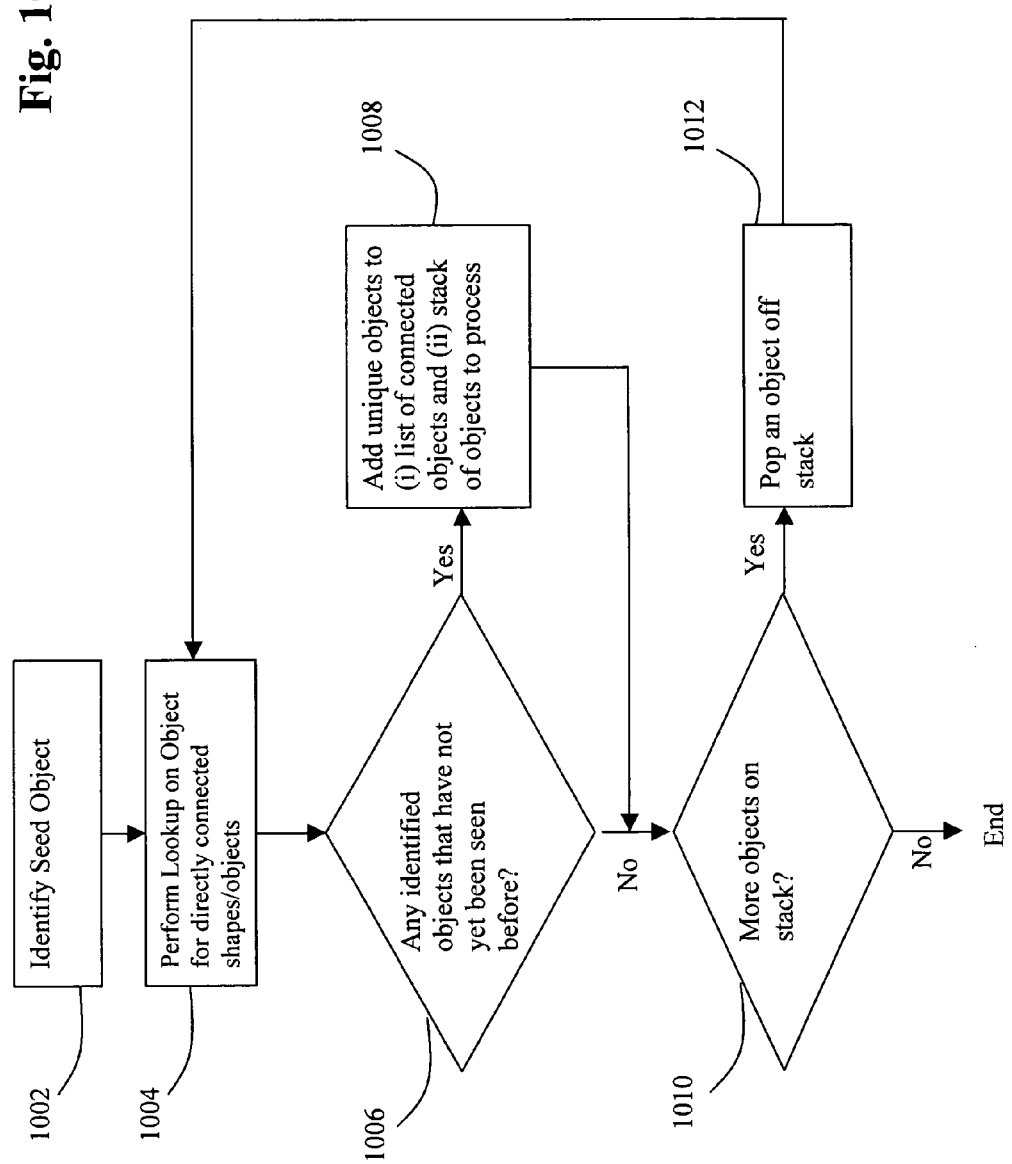
FIG. 10 is a flowchart of a process for connectivity identification according to an embodiment of the invention.

FIG. 10 shows a flowchart of an embodiment of a process for chasing a set of connected shapes and/or objects (collectively referred to herein as "objects"). At 1002, a seed object is identified for the object. The seed object is the object that is initially identified for which it is desired to identify all connected objects. Any suitable approach may be used to identify the seed object. For example, a graphical user interface may be employed to allow a user to select a displayed shape on an interface screen/window. Other and additional approaches, without limitation, may be employed to identify the initial seed object.

In the preferred embodiment, two structures are maintained to track identified objects during the course of this process. The first structure is a list of connected objects. As each object is identified that is connected to the seed object, whether directly or indirectly, an identifier for the connected object is added to the list of connected objects. By the end of the process, the final composition of this list contains the identity of all objects that are connected to the seed object.

The second structure that is maintained is a list of objects that need to be processed for shape-connected look-up during the course of the process. From time-to-time as the present process is performed, additional objects will be recognized for which it is desired to check for connectivity. These additional objects are added to this list to ensure that they are adequately checked for connectivity. In one embodiment, this list is formed as a stack, with objects processed in a last-in/first-out queue arrangement.

At 1004, a look-up is performed to identify any objects/shapes that are directly shorted to the object under examination. For the initial loop-run of the process, the object under examination is the initial seed object. For any additional loop-runs of the process, the object under examination is an object that has been popped off the stack (e.g., an object from the list of objects to be process for shape-connected look-up).

One approach for performing action 1004 is to create a search window that possesses exactly the shape of the object under examination, and then use the process of FIG. 7 to identify all objects which touch or fall within that search window. This look-up will identify all objects, whether on the same level of the design hierarchy or on a different level of the hierarchy, that are directly connected to the object under examination.

For any objects that are identified, a determination is made whether it has already been seen during execution of the process (1006). One approach for performing this action is to search the first list of connected objects. If the presently identified object is already on the list, then it has already been seen, and will not be processed again. If, however, the presently identified object is not on the list, then it is a newly identified object. For such newly identified objects, (i) the identifier for the object is added to the first list of connected objects and (ii) the object is added to the second list of objects to be process for shape-connectivity look-up (action 1008).

Once look-up has completed for the object under examination, a determination is made whether the are any additional objects in the stack/second list of objects to be process for shape-connectivity look-up (1010). If not, then the process ends. The objects in the first list of connected objects provides identification of all objects connected to the initial seed object.

If there is an object still in the stack/second list of objects to be process for shape-connectivity look-up, then an object is popped from the stack and becomes the new object under examination (1012). The process then returned back to action 1004 to process shape-connectivity look-up upon the new object under examination.

Figure 11:
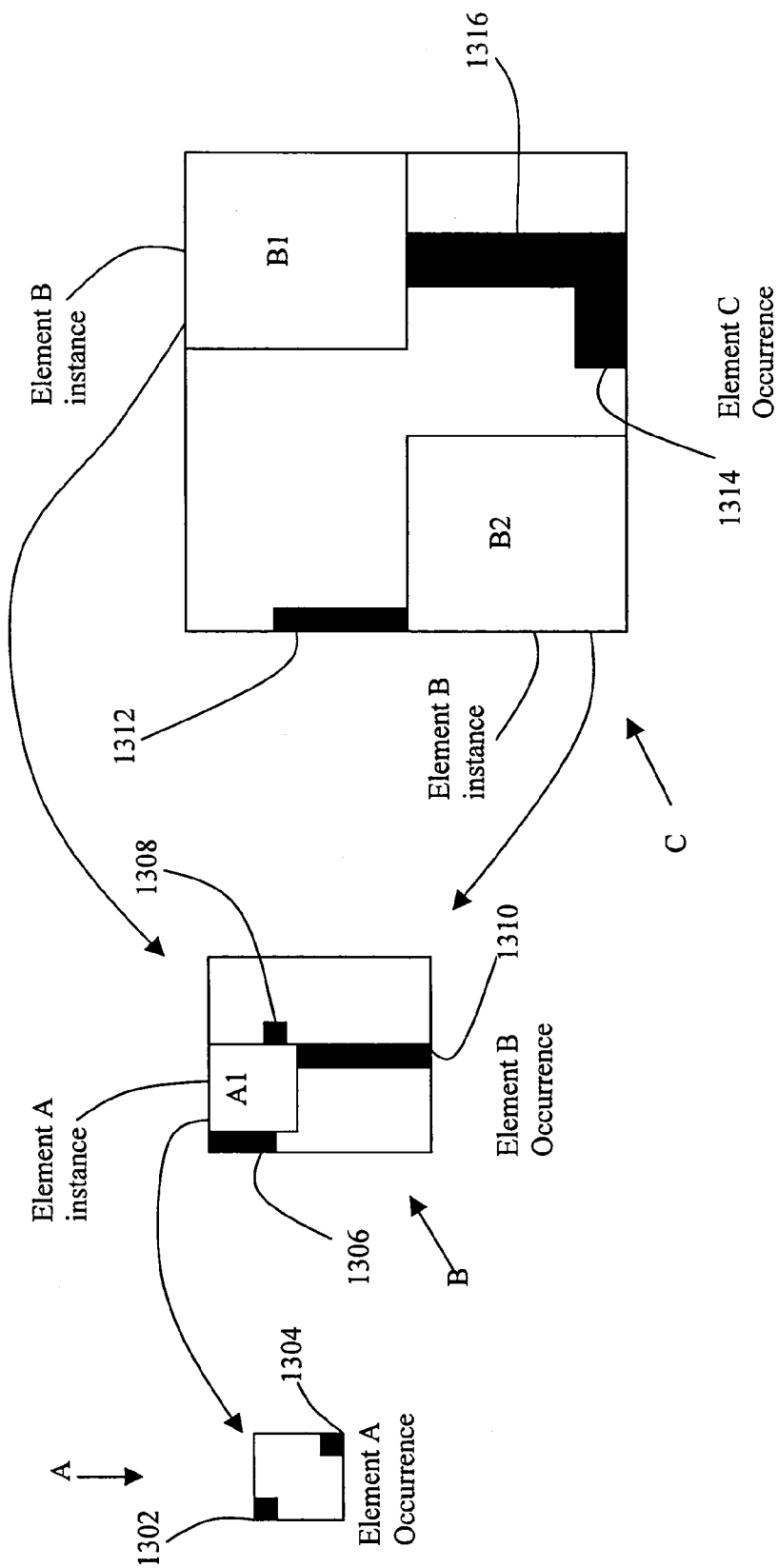
FIG. 11 shows an example design hierarchy.

To illustrate the process of FIG. 10, reference is now made to the example design hierarchy shown in FIG. 11. The element A occurrence includes two shapes 1302 and 1304. At a different level in the IC design, an occurrence of element B includes its own shapes 1306, 1308, and 1310 as well as an instance A1 of element A. At yet another level of the IC design, an occurrence of element C includes shapes 1312, 1314, and 1316 as well as two instances B1 and B2 of element B. Instances B1 and B2 each contain their own nested instance of element A. In the hierarchy of FIG. 13, each instance provides a logical reference to its master occurrence rather than a physical manifestation of the occurrence at the instance locations. For purposes of this example, it is assumed that all shapes are on the same layer of the design.

Figure 12:
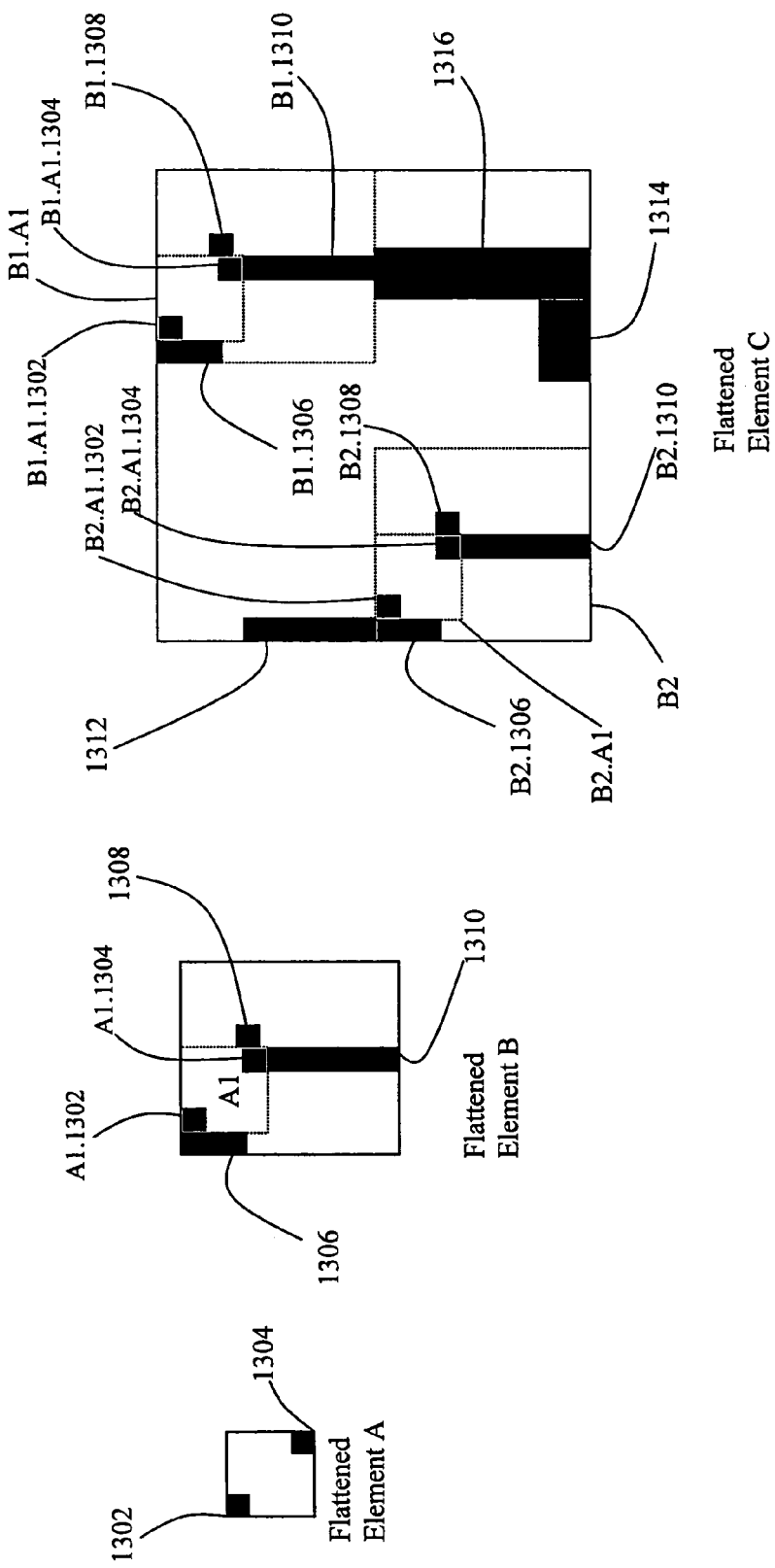
FIG. 12 shows a flattened version of the design hierarchy of FIG. 13.

In the traditional approach to extracting connectivity the entire design hierarchy would be flattened to allow one to determine the shapes that connect to one another. Here, if it is desired to extract the nets for this hierarchy under the traditional approach, then each of the elements A, B, and C would be flattened. FIG. 12 shows a flattened view of the design hierarchy of FIG. 11. In the flattened view, rather than inserting instances of elements into the design, actual copies of the shapes from the different levels of the design are placed in the appropriate locations within the design data. As shown in FIG. 12, the flattened view of the element A occurrence does not change since it does not contain any instances of shapes from other levels of the design. However, the flattened version of element B explicitly includes shapes A1.1302 and A1.1308, rather than an instance A1 that refers back to the master occurrence for Element A. Similarly, the flattened version of element C explicitly includes shapes B1.1306, B1.1308, and B1.1310 rather than an instance B1 that refers back to the m aster occurrence for Element B. In addition, it is noted that rather than including a nested instance A1 in instance B1, element C explicitly includes shapes B1.A1.1302 and B1.A1.1304 instead of a reference to these shapes in the master occurrence for Element A. Likewise, rather than including an instance B2 and its nested instance B2.A1 in element C that implicitly references the shapes associated with these instances, the flattened version of Element C explicitly includes shapes B2.1306, B2.1308, B2.1310, B2.A1.1302, and B2.A1.1304.

By flattening this design hierarchy, it can easily be seen, at each level of the hierarchy, which of the shapes connect to one another. Therefore, flattening the entire design provides a fairly simplistic approach for identify nets in a hierarchical design. Each collection of connected shapes at a given level would comprise its own net at that level.

However, flattening the entire design to extract connectivity information can also be highly inefficient. While only a simple design hierarchy is shown in FIGS. 11-12, imagine a more typical design that includes many thousands or millions of shapes (and numerous levels of nested instances), with many thousands or millions of instances to unfold that are scattered throughout the hierarchical design. A significant amount of system resources must be expended just to unfold the design before connectivity extraction can be performed, which would affect the speed in which it takes to obtain results and possibly affect other work being performed on the system. Moreover, once the shapes in the design have been unfolded, a considerable amount of system memory would be needed to store and operate upon the flattened design. This is, of course, despite the fact that the same set of shapes would be repeated over and over again for each unfolded instance of the same design element. A small example of this inefficiency can be seen in FIG. 12 in which the flattened version of Element C explicitly includes all the shapes for both instance B1 and B2, even though both instances refer to the same set of shapes. This example of inefficiency is multiplied many times over in a typical hierarchical design in which a master occurrence for a design element may be instantiated many thousands or millions of times.

The present embodiment of the invention provides an approach for extracting connectivity from a hierarchical design in which the entire design does not have to be unfolded. FIGS. 13a-f illustrate an embodiment of this process against the design hierarchy of FIG. 11. The present illustrated example will be described with reference to the actions shown in the flowcharts of FIG. 10.

Figure 13A:
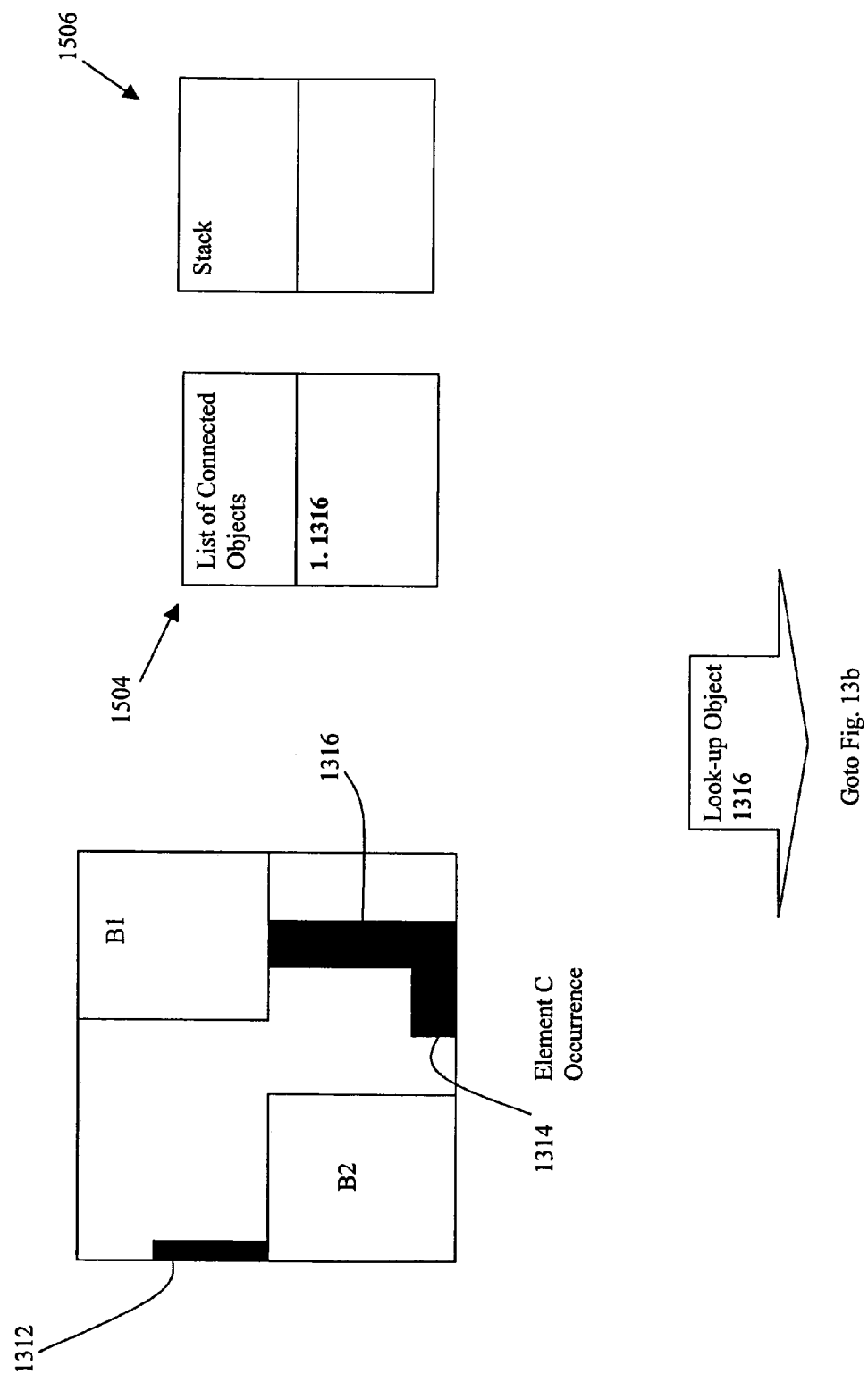

As noted in the description of the flowchart of FIG. 10, an initial seed object is identified for processing. Referring to FIG. 13a, assume that object 1316 in an occurrence of element C is the initially identified seed object. Therefore, it is desired to identify all objects that are shorted to object 1316, regardless of the exact hierarchical level of the design to which the connected objects belong. Further, it is desired to create this list of connected shapes without unfolding the entire design.

A list structure 1504 is maintained to track the connected objects that are identified. At the beginning of processing, only the initial seed object 1316 has been placed into list 1504.

A stack structure 1506 is maintained to track additional objects that is yet to be process for connectivity look-up. At the beginning of processing, no additional objects has yet been identified for further connectivity look-up. Therefore, stack 1506 is empty at this point.

Figure 13B:
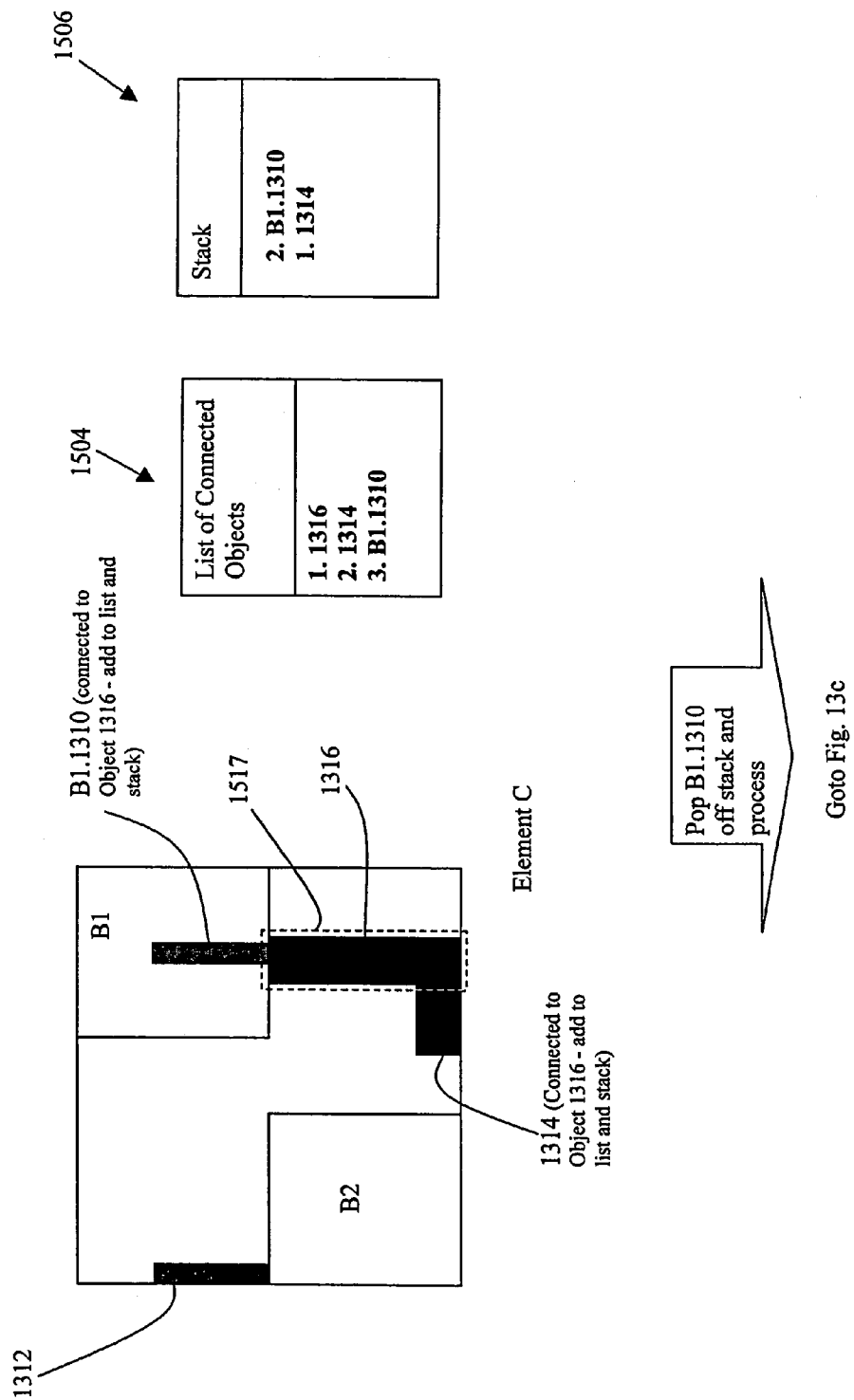

Referring to FIG. 13b, the next action is to perform connectivity look-up on object 1316. This is performed by creating a search window 1517 that is configured to be exactly the shape of object 1316, and executing the process of FIG. 7 against this search window. It is noted that the search window 1517 in FIG. 13b is drawn slightly larger than the object 1316 to facilitate visualization for the reader, and is not intended to represent the exact size/shape of search window 1517.

It can be seen that object 1314 either touches or falls within search window 1517. Since object 1314 is on the same hierarchical level as object 1316, no unfolding of the design was required to make this determination. By checking list 1504 (the previous version of FIG. 13a), it can be determined that object 1314 has not yet been seen in the context of shape chasing for object 1316. Therefore, the identifier for object 1314 is added to both the list 1504 and the stack 1506.

Instance B1 also touches or falls within the boundaries of search window 1517. Here, the shapes within element B1 are at a different hierarchical level of the design from object 1316. As previously described, the process of FIG. 7 and the shadow tree for element B can be used to determine which of the shapes within instance B1 touch or fall within the search window 1517. In effect, this process performs selective unfolding of just element B1 (at this point) to determine which of the shapes within element B1 are directly connected to object 1316. Here, an examination of the unfolded element B1 makes it clear that object B1.1310 is connected to object 1316. Since object B1.1310 has not yet been seen in the context of shape chasing for object 1316, the identifier for object B1.1310 is added to both the list 1504 and the stack 1506.

There are no additional objects falling within search window 1517, and therefore t are no additional objects directly connected to object 1316. A determination is now made whether there are any objects in the stack 1506 that are waiting to be processed. Here, there are two objects (object B1.1310 and object 1314) in stack 1506. Therefore, the process continues.

Referring to FIG. 13c, the next action is to pop object B1.1310 off stack 1506 and perform connectivity look-up on this object. This is performed by creating a search window 1519 that is configured to be exactly the shape of object B1.1310, and executing the process of FIG. 7 against this search window 1519.

It can be seen that object 1316 either touches or falls within search window 1519. By checking list 1504, it can be determined that object 1316 is already on the list 1504 and therefore has already been seen in the context of shape chasing during the present procedure. Therefore, the identifier for object 1316 is not added to either the list 1504 or the stack 1506.

Instance A1 touches or falls within the boundaries of search window 1519. Here, the shapes within element A1 are at a different hierarchical level of the design from object B1.1310. As previously described, the process of FIG. 7 and the shadow tree for element A can be used to determine which of the shapes within instance A1 touch or fall within the search window 1519. In effect, this process performs selective unfolding of just element A1 (at this point) to determine which of the shapes within element A1 are directly connected to object B1.1310. Here, an examination of the unfolded element A1 makes it clear that object B1.A1.1304 is connected to object B1.1310. Since object B1.A1.1304 has not yet been seen in the context of the present shape chasing procedure, the identifier for object B1.A1.1304 is added to both the list 1504 and the stack 1506.

There are no additional objects falling within search window 1519, and therefore no additional objects directly connected to object B1.1310. A determination is now made whether there are any objects in the stack 1506 that are waiting to be processed. Here, there are two objects (object B1.A1.1304 and object 1314) in stack 1506. Therefore, the process continues.

Referring to FIG. 13d, the next action is to pop object B1.A1.1304 off stack 1506 and perform connectivity look-up on this object. This is performed by creating a search window 1521 that is configured to be exactly the shape of object B1.A1.1304, and executing the process of FIG. 7 against this search window 1521.

It can be seen that object B1.1310 either touches or falls within search window 1521. By checking list 1504, it can be determined that object B1.1310 is already on the list 1504 and therefore has already been seen in the context of shape chasing during the present procedure. Therefore, the identifier for object B1.1310 is not added to either the list 1504 or the stack 1506.

Object B1.1308 also touches or falls within the boundaries of search window 1521. It can be determined that object B1.1308 has not yet been seen in the context of the present procedure for shape chasing. Therefore, the identifier for object B1.1308 is added to both the list 1504 and the stack 1506.

There are no additional objects falling within search window 1521, and therefore no additional objects directly connected to object B1.A1.1304. A determination is now made whether there are any objects in the stack 1506 that are waiting to be processed. Here, there are two objects (object B1.1308 and object 1314) in stack 1506. Therefore, the process continues.

Referring to FIG. 13e, the next action is to pop object B1.1308 off stack 1506 and perform connectivity look-up on this object. This is performed by creating a search window 1523 that is configured to be exactly the shape of object B1.1308, and executing the process of FIG. 7 against this search window 1523.

It can be seen that object B1.A1.1304 either touches or falls within search window 1523. By checking list 1504, it can be determined that object B1.A1.1304 is already on the list 1504 and therefore has already been seen in the context of shape chasing during the present procedure. Therefore, the identifier for object B1.A1.1304 is not added to either the list 1504 or the stack 1506.

There are no additional objects falling within search window 1523, and therefore no additional objects directly connected to object B1.1308. A determination is now made whether there are any objects in the stack 1506 that are waiting to be processed. Here, there is still one object (i.e., object 1314) in stack 1506. Therefore, the process continues.

Figure 13F:
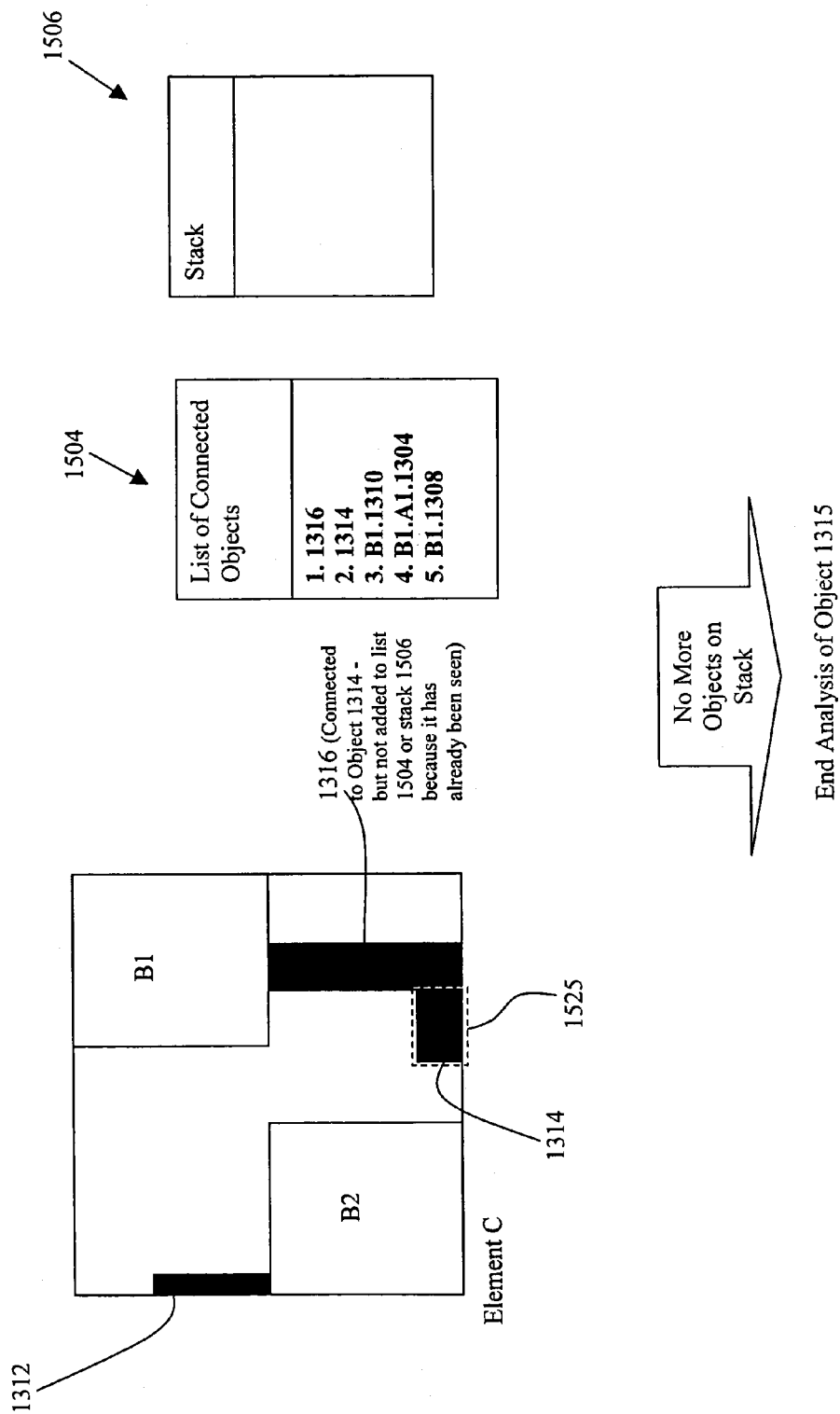

Referring to FIG. 13f, the next action is to pop object 1314 off stack 1506 and perform connectivity look-up on this object. This is performed by creating a search window 1525 that is configured to be exactly the shape of object 1314, and executing the process of FIG. 7 against this search window 1523.

It can be seen that object 1316 either touches or falls within search window 1525. By checking list 1504, it can be determined that object 1316 is already on the list 1504 and therefore has already been seen in the context of shape chasing during the present procedure. Therefore, the identifier for object 1316 is not added to either the list 1504 or the stack 1506. There are no additional objects falling within search window 1525, and therefore no additional objects directly connected to object B1.1308.

A determination is now made whether there are any objects in the stack 1506 that are waiting to be processed. Here, there is are no more objects waiting to be processed in stack 1506. Therefore, the process ends.

The final contents of list 1504 can be reviewed to identify the specific objects which are connected, directly or indirectly, to the original seed object 1316. An examination of list 1504 shows that the following objects are connected together: (1) object 1316; (2) object 1314; (3) object B1.1310; (4) object B1.A1.1304; and (5) B1.1308.

It is noteworthy to mention that this analysis was performed without the requirement of unfolding the entire design. Instead, the procedure only involved unfolding specific portions of the design relevant to objects to be examined. In the present example, it can be seen that in element C, only instance B1 was unfolded during the shape chasing analysis—the process did not unfold another instance B2 within the same element C.

In an alternate embodiment, connectivity for specific elements are extracted and stored. Instead of unfolding on-the-fly, the stored information for an element is accessed during the shape chasing process and used to identify connected objects for specific instances of those elements. One approach for implementing this approach is to use the process for identifying connectivity at each hierarchical level described in co-pending U.S. application Ser. No. 11/229,320, entitled "METHOD AND MECHANISM FOR IDENTIFYING AND TRACKING SHAPE CONNECTIVITY", filed on even date herewith, which is hereby incorporated by reference in its entirety. This type of procedure can be done ahead of time to pre-extract connectivity for some or all elements at different hierarchical levels of the design. Alternatively, this approach can be performed by merely storing connectivity information for elements that instances of elements as they are analyzed, so that analysis of other instances of the same element will not require the same extensive unfolding that was required for the first instance analyzed for the element.

Therefore, what has been described is a method and mechanism for identifying connected objects in an integrated circuit design. The present invention may be embodied as any combination of software, hardware, computer usable medium, or manual operations. In one specific embodiment, the invention is embodied as an EDA software tool for placing and/or routing integrated circuit designs.

These and other embodiments of the present invention may be realized in accordance with the above teachings and it should be evident that various modifications and changes may be made to the above-described embodiments without departing from the broader spirit and scope of the invention. The specification and drawings are, accordingly, to be regarded in an illustrative rather than restrictive sense and the invention measured only in terms of the claims.

System Architecture Overview

Figure 14:
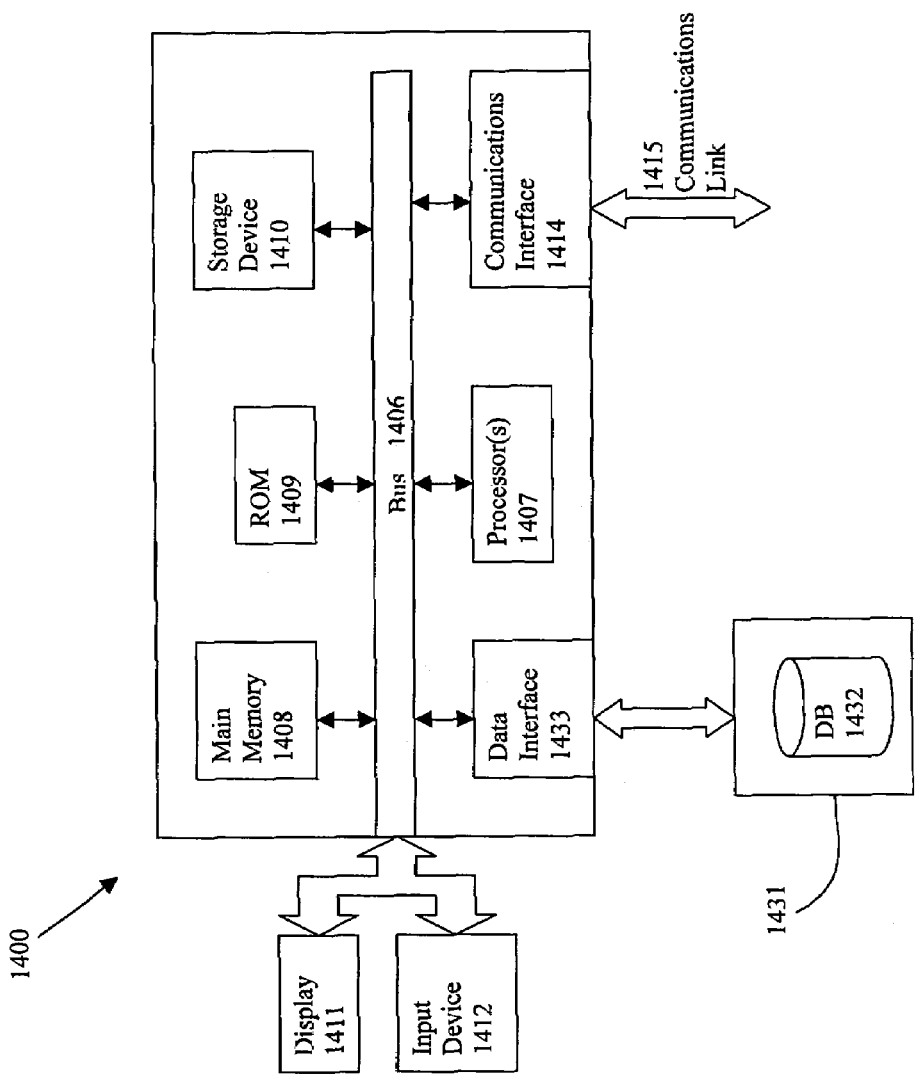
FIG. 14 illustrates an example computer system in which a method and mechanism for determining shape connectivity can take place.

The execution of the sequences of instructions required to practice the invention may be performed in embodiments of the invention by a computer system 1400 as shown in FIG. 14. In an embodiment of the invention, execution of the sequences of instructions required to practice the invention is performed by a single computer system 1400. According to other embodiments of the invention, two or more computer systems 1400 coupled by a communication link 1415 may perform the sequence of instructions required to practice the invention in coordination with one another. In order to avoid needlessly obscuring the invention, a description of only one computer system 1400 will be presented below; however, it should be understood that any number of computer systems 1400 may be employed to practice the invention.

A computer system 1400 according to an embodiment of the invention will now be described with reference to FIG. 14, which is a block diagram of the functional components of a computer system 1400 according to an embodiment of the invention. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals, that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated non-volatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g. instructions, messages and data. In embodiments of the invention, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment of the invention, an individual computer system 1400 performs specific operations by their respective processor(s) 1407 executing one or more sequences of one or more instructions contained in the main memory 1408. Such instructions may be read into the main memory 1408 from another computer-usable medium, such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions to implement the invention. Thus, embodiments of the invention are not limited to any specific combination of hardware circuitry and/or software.

The term "computer-usable medium," as used herein, refers to any medium that provides information or is usable by the processor(s) 1407. Such a medium may take many forms, including, but not limited to, non-volatile and volatile media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense.

What is claimed is:

1. A method for identifying connectivity for an object in a hierarchical configuration of objects representing an integrated circuit design, comprising:
   (a) identifying a seed object for which information about connectivity to other objects is desired;
   (b) determining other objects that are directly connected to the seed object, wherein the act of determining the other objects comprises unfolding the hierarchical configuration only for one or more instances of elements which are directly connected to the seed object;
   (c) selecting one or more of the other objects as the seed object and repeating (a) and (b); and
   (d) providing a list of connected objects within the integrated circuit design based upon the results of (a), (b), and (c).

2. The method of claim 1 in which only the other objects which have not yet been processed are selected as the seed object.

3. The method of claim 1 in which a connected objects list structure is maintained to track identified connected objects.

4. The method of claim 3 in which other objects which have not yet been processed from (b) are added to the connected objects list structure.

5. The method of claim 3 in which the connected objects list structure is accessed to provide the list of connected objects.

6. The method of claim 1 in which a stack structure is maintained to track the one or more of the other objects to selected as the seed object.

7. The method of claim 1 in which the entire hierarchical configuration of objects representing the integrated circuit design is not unfolded.

8. The method of claim 1 in which connectivity information about elements are extracted and stored.

9. The method of claim 8 in which the connectivity information is pre-extracted.

10. The method of claim 8 in which the connectivity information is extracted and stored for each instance of an element that is processed.

11. The method of claim 8 in which the connectivity information comprises virtual terminal that references shapes in a net at one or more hierarchical levels in the integrated circuit design.

12. The method of claim 1 in which the act of determining the other objects that are directly connected to the seed object comprises forming a search window that is sized and shaped corresponding to the seed object.

13. The method of claim 12 in which the act determining the other objects that are directly connected to the seed object comprises searching a shadow tree for the other objects at different hierarchical levels.

14. A computer program product comprising a computer readable medium storing thereon instructions which, when executed by a processing system, cause the system to perform a method for extracting connectivity for identifying connectivity for an object in a hierarchical configuration of objects representing an integrated circuit design, the method comprising:
 (a) identifying a seed object for which information about connectivity to other objects is desired;
 (b) determining other objects that are directly connected to the seed object, wherein the act of determining the other objects comprises unfolding the hierarchical configuration only for one or more instances of elements which are directly connected to the seed object;
 (c) selecting one or more of the other objects as the seed object and repeating (a) and (b); and
 (d) providing a list of connected objects within the integrated circuit design based upon the results of (a), (b), and (c).

15. A system for identifying connectivity for an object in a hierarchical configuration of objects representing an integrated circuit design, comprising:
 (a) logic for identifying a seed object for which information about connectivity to other objects is desired;
 (b) logic for determining other objects that are directly connected to the seed object, wherein the act of determining the other objects comprises unfolding the hierarchical configuration only for one or more instances of elements which are directly connected to the seed object;
 (c) logic for selecting one or more of the other objects as the seed object and repeating (a) and (b); and
 (d) providing a list of connected objects within the integrated circuit design based upon the results of (a), (b), and (c).

* * * * *